(12) United States Patent
Shimooka et al.

(10) Patent No.: US 6,781,236 B2
(45) Date of Patent: Aug. 24, 2004

(54) SEMICONDUCTOR DEVICE USING A MULTILAYER WIRING STRUCTURE

(75) Inventors: Yoshiaki Shimooka, Kawasaki (JP);
Noriaki Matsunaga, Chigasaki (JP);
Hideki Shibata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/052,259

(22) Filed: Jan. 23, 2002

(65) Prior Publication Data

US 2003/0109084 A1 Jun. 12, 2003

(30) Foreign Application Priority Data

Dec. 6, 2001 (JP) .......................................... 2001-372974

(51) Int. Cl.[7] .............................................. H01L 23/12
(52) U.S. Cl. ........................ 257/758; 438/128; 257/760

(56) References Cited

U.S. PATENT DOCUMENTS 6,373,740 B1 * 4/2002 Forbes et al. ................. 365/51

OTHER PUBLICATIONS

Y. Odate, et al., IEEE, Electronic Components and Technology Conference, pp. 526–529, "A Measurement and Simulation Study of Transmission Lines on Microstrip and Stacked–Pair Structure for High Speed Signals", May 2000.

T. Suga, Nikkel Microdevice, Part 5 Package Technology, pp. 136–143, "There is no Solution only with LSI", Jul., 2000 (with Partial English translation, pp. 1–10).

* cited by examiner

Primary Examiner—David Nelms
Assistant Examiner—Thao P. Le
(74) Attorney, Agent, or Firm—Oblon, Spivak, McClelland, Maier & Neustadt, P.C.

(57) ABSTRACT

This invention includes a signal line 17, through which a signal having a desired frequency $f_0$ passes, formed on a semiconductor substrate 10, and a differential signal line 13 through which a signal in opposite phase to the signal passing through the signal line passes, or which is connected to a ground power supply, the signal line and the differential signal line are formed so as to be substantially in parallel with each other via an insulating layer 15, and an actual wiring length l of the signal line is longer than a wiring length $l_0$ determined by the following equation $$l_0 = \sqrt{\frac{\frac{L}{C} + \sqrt{\frac{R^2 + 8\pi^2 f_0^2 L^2}{4\pi^2 f_0^2 C^2}}}{R^2 + 4\pi^2 f_0^2 L^2}}$$

where R represents a resistance component, L represents an inductance component, and C represents a capacitance component, per unit length of the signal line when no differential signal line exists.

11 Claims, 22 Drawing Sheets

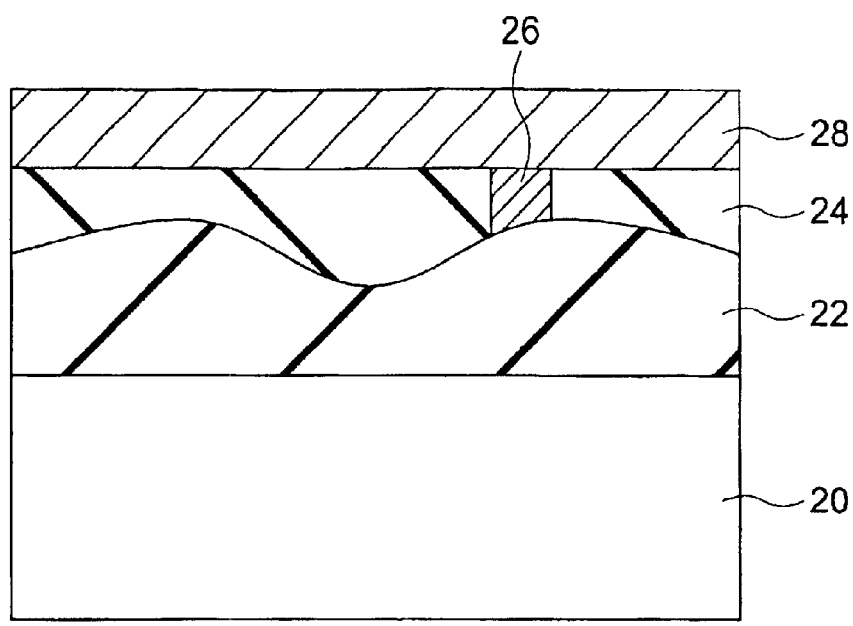
F I G. 5
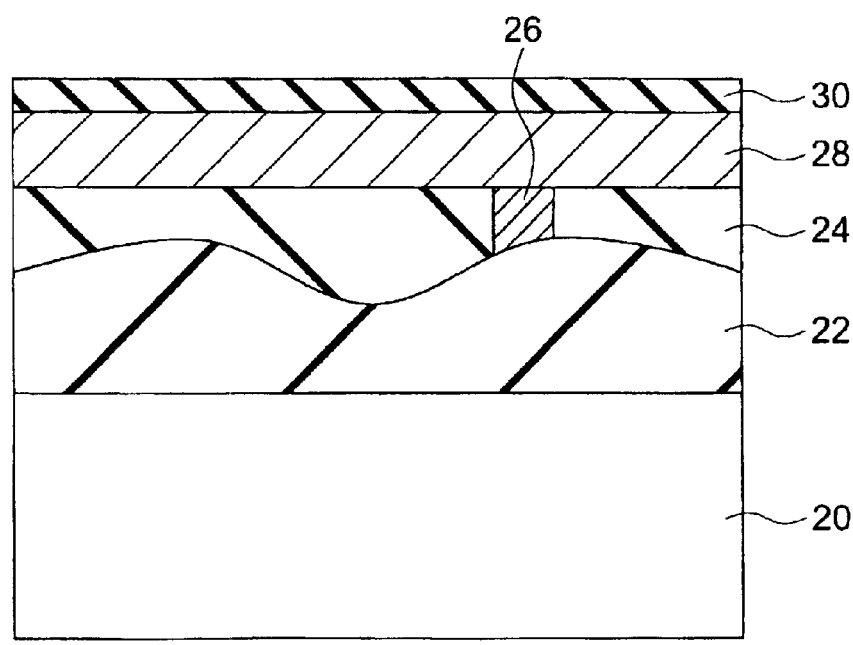
F I G. 6

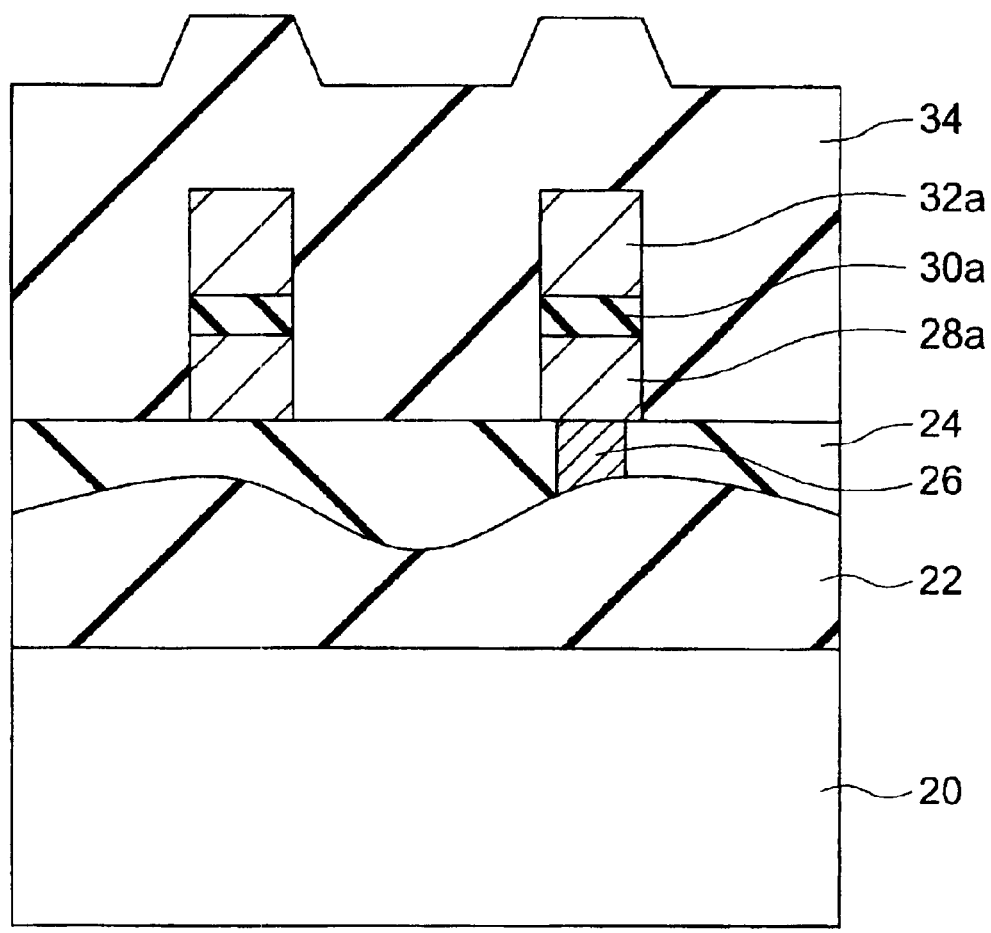
F I G. 9

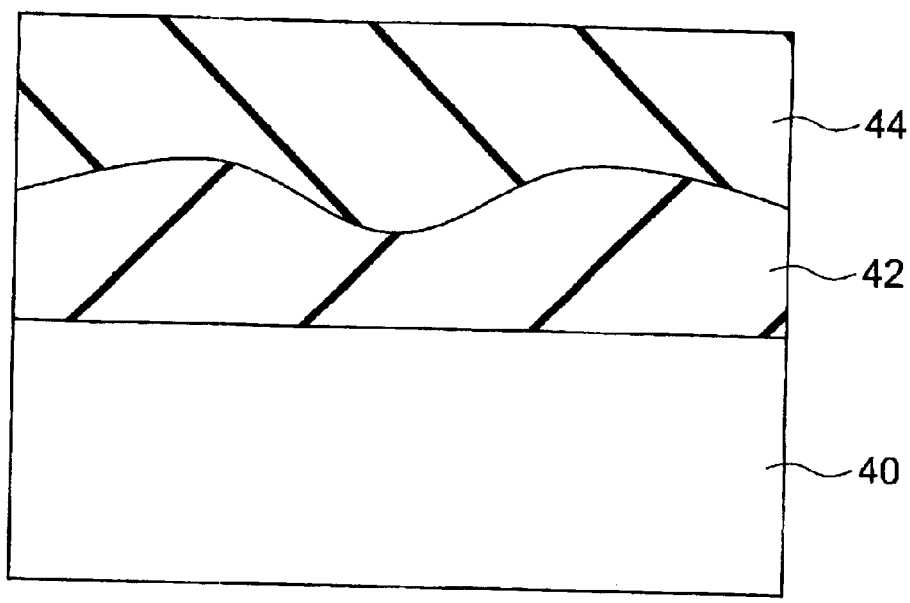
F I G. 12
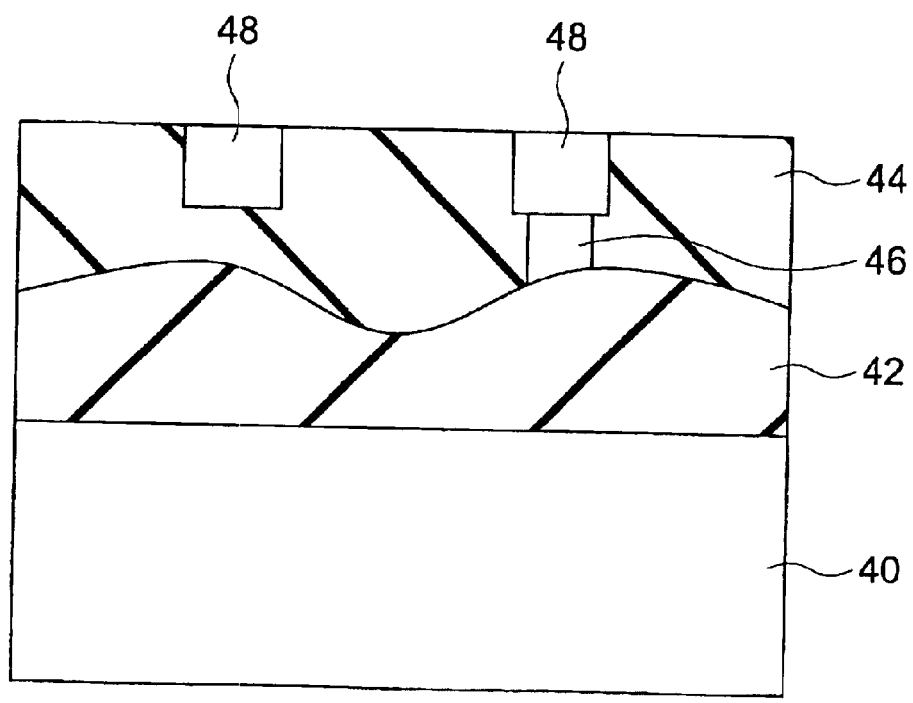
F I G. 13

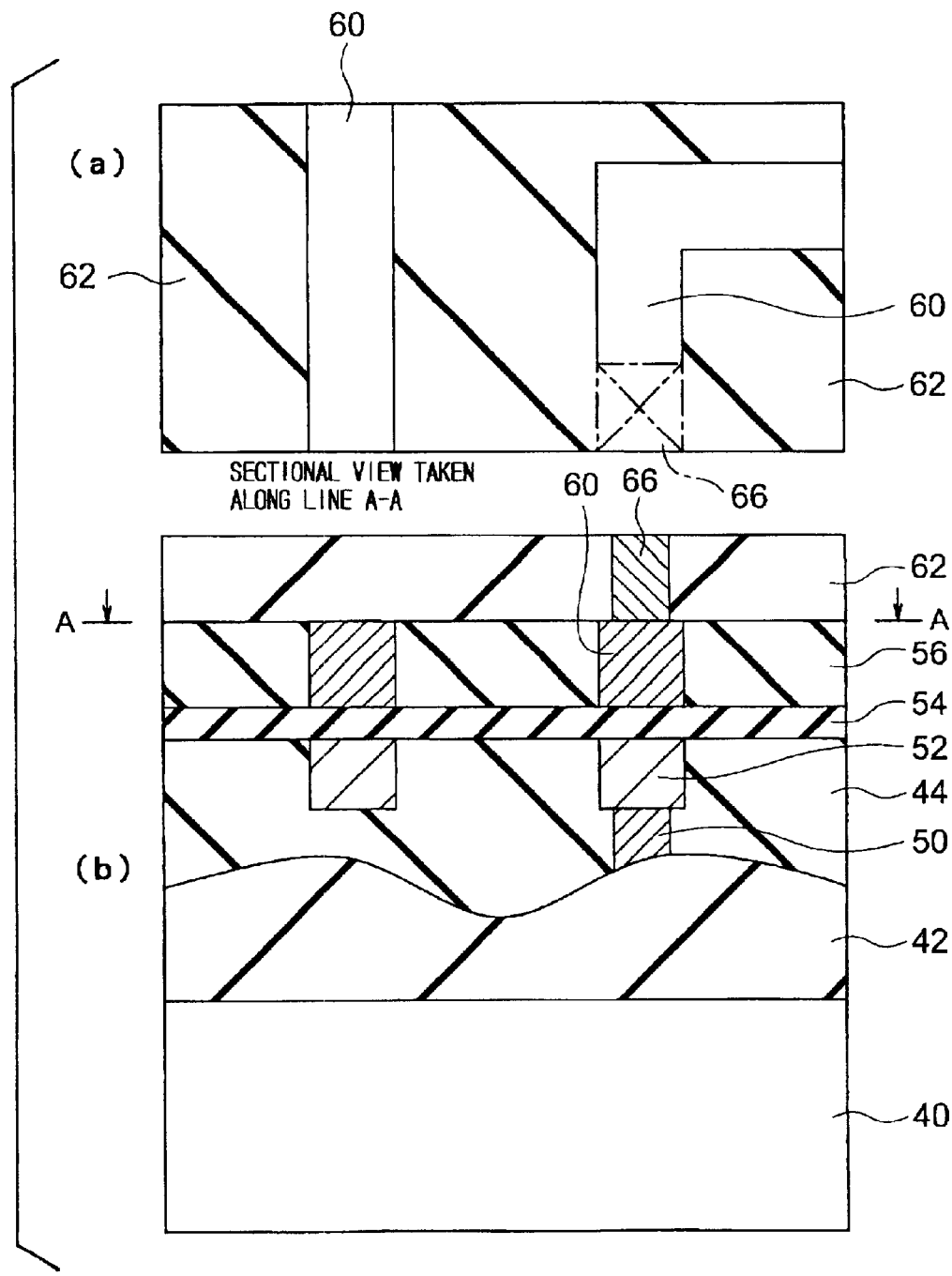
F I G. 21

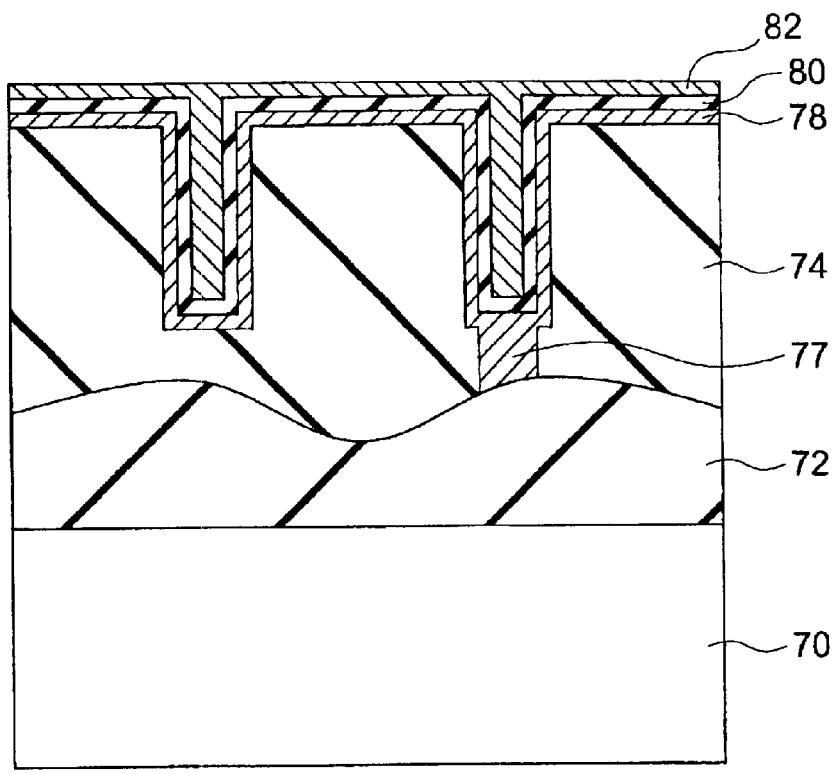
F I G. 28
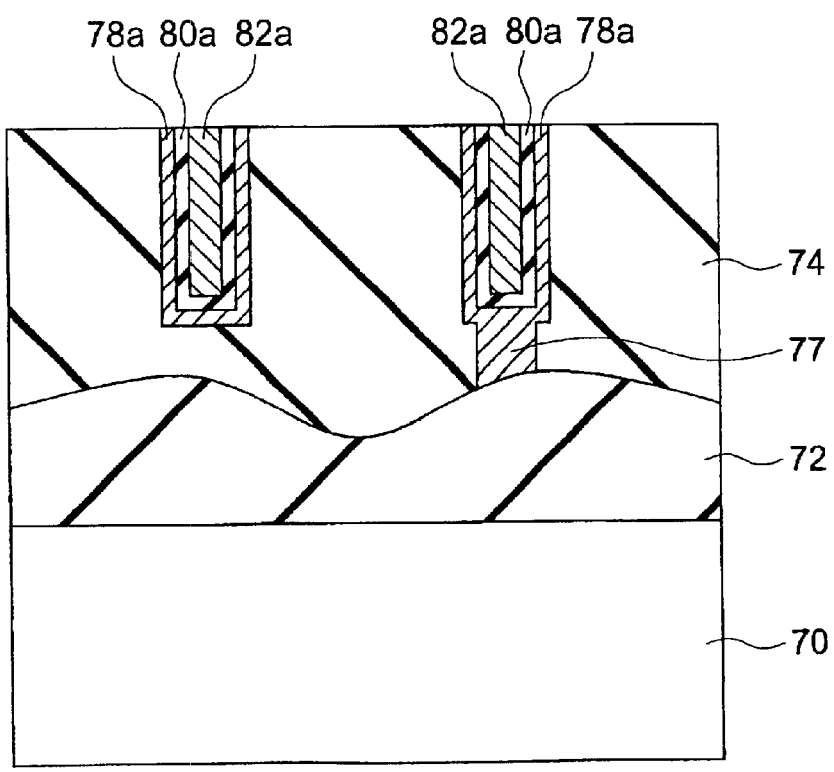
F I G. 29

SEMICONDUCTOR DEVICE USING A MULTILAYER WIRING STRUCTURE

CROSS-REFERENCE TO RELATED APPLICATIONS

This application is based upon and claims the benefit of priority from the prior Japanese Patent Application No. 2001-372974, filed on Dec. 6, 2001, the entire contents of which are incorporated herein by reference.

BACKGROUND OF THE INVENTION

1. Field of the Invention

The present invention relates to a semiconductor device using a multilayer wiring structure, and a method of manufacturing the same.

2. Related Art

Recently, large scale integrated circuits (hereinafter also referred to as "LSIs") are facing the problem of the limitation in speeding up. In a conventional LSI, the speed-up of the entire LSI has been achieved by inhibiting a gate delay to speed up transistors. However, in such a conventional LSI having an operating frequency of 1 GHz or more, a wiring delay may have ooccured, which inhibits the speed-up of the LSI. Further, as the miniaturization of LSIs has proceeded, the distance between adjacent wirings has been reduced. As a result, interference between signal lines has become noticeable. Accordingly, attempts have been made to inhibit wiring delay by the use of the material technology, in which conventional Al alloy wiring and $SiO_2$ insulating films are replaced by Cu wiring having a low resistivity and interlayer insulating films having a low permittivity.

However, although it is possible to inhibit RC delay, which is proportional to the product of wiring resistance R and wiring capacitance C, with the above-described improve in material, it is difficult to eliminate the influence of wiring inductance L. Especially, in a long wiring between circuit blocks, etc., the influence of wiring inductance increases because of the long length of the wiring, so that the influence of LC becomes more dominant than the influence of RC delay. In order to eliminate such an influence, the use of a microstrip line structure taken into consideration for a long wiring.

FIG. 33 shows a structure of a conventional semiconductor device having multilayer wiring and microstrip structure. This conventional semiconductor device has the following multilayer wiring structure: an insulating layer 901 is formed on a semiconductor substrate 900, on which devices not shown (for example, transistors) are formed; an insulating layer 902 is formed on the insulating layer 901; a metal layer 903 serving as a grounding electrode is formed 16 on the insulating layer 902; signal lines 905 are formed on the metal layer 903 via an insulating layer 904; the signal lines 905 are covered by an insulating layer 906; and a metal layer composed of grounding electrodes, an insulating layer, a signal line layer, etc., which are not shown, are formed on the insulating layer 906. In the microstrip line structure thus constituted, the signal lines 905 are sandwiched by the plane grounding electrode 903 and the power supply electrode, which is effective to reduce the influence of LC.

However, in the microstrip line structure as shown in FIG. 33 using the plane grounding electrode 903, since lines of electric field and magnetic field (electromagnetic field) directed from the signal lines 905 to the grounding electrode 903 are formed, as shown in FIG. 34, interference between vertically adjacent signal lines is inhibited. However, since the degree of the expansion of the electric flux lines and the magnetic field lines are large, the electric flux lines and the magnetic field lines reach horizontally adjacent signal lines. Accordingly, it is not possible to inhibit interference between horizontally adjacent signal lines.

Thus, in a microstrip line structure, as the wiring pitch is reduced due to miniaturization, the influence of the horizontally adjacent lines are increased. Accordingly, this structure has a problem that it cannot be applied to further miniaturization.

SUMMARY OF THE INVENTION

A semiconductor device according to an aspect of the present invention includes: a signal line, through which a signal having a desired frequency $f_0$ passes, formed on a semiconductor substrate,; and a differential signal line through which a signal in opposite phase to the signal passes, or which is connected to a ground power supply, the signal line and the differential signal line being laminated via an insulating layer so as to be substantially in parallel with each other, and an actual wiring length l of the signal line being longer than a wiring length $l_0$ determined by the following equation $$l_0 = \sqrt{\frac{\frac{L}{C} + \sqrt{\frac{R^2 + 8\pi^2 f_0^2 L^2}{4\pi^2 f_0^2 C^2}}}{R^2 + 4\pi^2 f_0^2 L^2}}$$

where R represents a resistance component, L represents an inductance component, and C represent a capacitance component per unit length of the signal line in such a case that the differential signal line does not exist.

A method of manufacturing a semiconductor device according to a first aspect of the present invention includes: forming a first conductive layer on a semiconductor substrate; forming an insulating layer on the first conductive layer; forming a second conductive layer on the insulating layer; and pattering the second conductive layer, the insulating layer, and the first conductive layer at a time to form a first wiring from the first conductive layer, and to form a second wiring from the second conductive layer.

A method of manufacturing a semiconductor device according to a second aspect of the present invention includes: forming a groove in a first insulating layer formed on a semiconductor substrate; forming a first wiring by filling the groove with a wiring material; forming a second insulating layer covering the first wiring; forming a third insulating layer on the second insulating layer; forming a second wiring by forming an opening extending to the second insulating layer through the third insulating layer at a position corresponding to the first wiring, and filling the opening with a wiring material.

A method of manufacturing a semiconductor device according to a third aspect of the present invention includes: forming a groove in a first insulating layer formed on a semiconductor substrate; forming a first wiring layer covering sides and a bottom of the groove; and forming a second wiring layer in the groove via a second insulating layer so as to cover the first wiring layer.

BRIEF DESCRIPTION OF THE DRAWINGS

FIG. 5 is a sectional view of still another stage of a method of manufacturing a semiconductor device according to the second embodiment of the present invention.

FIG. 6 is a sectional view of still another stage of a method of manufacturing a semiconductor device according to the second embodiment of the present invention.

FIG. 9 is a sectional view of a further stage of a method of manufacturing a semiconductor device according to the second embodiment of the present invention.

FIG. 12 is a sectional view of one stage of a method of manufacturing a semiconductor device according to a third embodiment of the present invention.

FIG. 13 is a sectional view of another stage of a method of manufacturing a semiconductor device according to the third embodiment of the present invention.

FIG. 21 is a sectional view of a yet further stage of a method of manufacturing a semiconductor device according to the third embodiment of the present invention.

FIG. 28 is a sectional view of still another stage of a method of manufacturing a semiconductor device according to the fourth embodiment of the present invention.

FIG. 29 is a sectional view of still another stage of a method of manufacturing a semiconductor device according to the fourth embodiment of the present invention.

DESCRIPTION OF EMBODIMENTS

Hereinafter, embodiments of the present invention will be described with reference to the accompanying drawings.

First Embodiment

Figure 1:
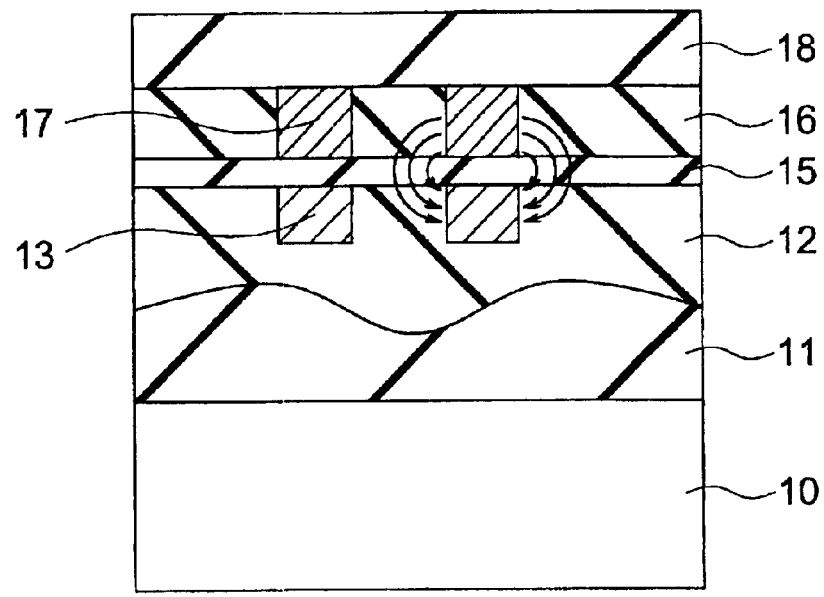
FIG. 1 is a sectional view showing the structure of a semiconductor device according to a first embodiment of the present invention.

FIG. 1 shows the structure of a semiconductor device according to a first embodiment of the present invention. The semiconductor device in this embodiment has a multilayer wiring structure, called the stacked pair line structure, in which a pair of signal line and differential signal line (in this specification, a differential signal line means a signal line through which a signal in opposite phase to that passing through the above signal line passes, or a grounding line) are vertically stacked via an insulating layer 15. That is, the signal lines 17 are formed on the insulating layer 15 at the locations corresponding to those of the differential signal lines 13 underneath the insulating layer 15. The semiconductor device of this embodiment shown in FIG. 1 has a structure that an insulating layer 11 is formed on a semiconductor substrate 10, on which devices such as transistors, etc., are formed, and a insulating layer 12 is formed on the insulating layer 11. The differential signal lines 13 (in this embodiment, grounding lines) are embedded in the insulating layer 12. An insulating layer 15 is formed so as to cover the differential lines 13 and the insulating layer 12. The purpose of the insulating layer 15 is to electrically separate the differential signal lines 13 and the signal lines 17. An insulating layer 16 is formed on the insulating layer 15, in which the signal lines 17 are embedded. The signal lines 17 and the differential signal lines 13 are located so as to be vertically stacked via the insulating layer 15 to make pairs. That is, in the main part of a chip, in which the semiconductor device according to the present invention is formed, the signal lines 17 and the differential signal lines 13 are formed so as to have substantially the same width, and to be substantially in parallel with each other, except for the portions near input and output terminals. The signal lines 17 and the insulating layer 16 are covered by an insulating layer 18.

In this embodiment, since the signal lines 17 and the differential signal lines 13 are vertically stacked via the insulating layer 15 to have substantially the same width and to be substantially in parallel with each other on the main part of a chip, lines of electric field and magnetic field (electromagnetic field) directed from a signal line 17 to the corresponding differential signal line 13 are formed within a narrow area including the signal line 17 and the corresponding differential signal line 13, as shown in FIG. 1. Accordingly, it is possible to prevent the influence of interference between not only vertically adjacent signal lines, but also horizontally adjacent signal lines. Thus, it is possible to achieve a structure suitable for miniaturization, with which a signal transmission with less interference can be achieved.

Such a structure is especially effective to reduce LC delay when the actual wiring length l of a single-layered signal line, which is not vertically stacked on a differential line via an insulating layer, is longer than a wiring length $l_0$ determined by the frequency $f_0$ used in the semiconductor device. This will be described below.

Figure 2:
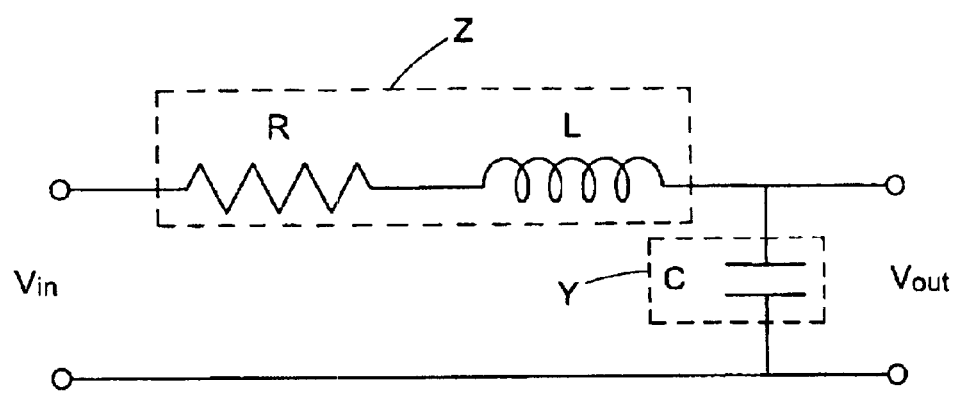
FIG. 2 is an equivalent circuit diagram of a signal wiring path.

It is assumed that the wiring path of a single-layered signal line is represented by an equivalent circuit diagram shown in FIG. 2. In FIG. 2, R, L, and C represent a resistance per unit length, an inductance per unit length, and a capacitance per unit length, respectively. Assuming that the frequency $f_0$ satisfying the equation $$(1/Y)/(Z+1/Y)=2^{-\frac{1}{2}}$$

with respect to a wiring length $l_0$ is called "cutoff frequency" where Z represents impedance, Y represents admittance, (Z+1/Y) represents input impedance, and (1/Y) represents output impedance. That is, cutoff frequency is defined as the frequency at which an input signal is attenuated by 3 dB. In such a case, impedances Z and (1/Y) can be represented by the following equations $$Z=R \cdot l_0+j(2f_0 \cdot L \cdot l_0)$$

$$1/Y=1/(j(2f_0 \cdot C \cdot l_0))$$

using resistance component R( ) per unit wiring length, inductance component L(H) per unit wiring length, and capacitance component C(F) per unit wiring length. If $l_0$ is obtained from the above equations, $l_0$ can be represented by the following equation.

$$l_0 = \sqrt{\frac{\frac{L}{C}+\sqrt{\frac{R^2+8\pi^2 f_0^2 L^2}{4\pi^2 f_0^2 C^2}}}{R^2+4\pi^2 f_0^2 L^2}}$$

Accordingly, in the case where the frequency used in the semiconductor device is $f_0$, and the wiring length l of a single-layered signal line of the semiconductor device is longer than $l_0$ determined by the above equation, signals transmitted through the single-layered signal line are attenuated, and the influence of LC delay appears.

In order to deal with the above problem, in the semiconductor device in this embodiment, the signal line in the single layer is formed so as to be vertically stacked on the corresponding differential signal line via an insulating layer. Accordingly, even if the wiring length l of the signal line 17 is longer than the wiring length $l_0$ determined by the above equation, it is possible to reduce the influence of LC, thereby accomplishing a signal transmission with less interference.

Second Embodiment

Next, a method of manufacturing a semiconductor device according to a second embodiment of the present invention will be described with reference to FIGS. 3 to 11.

Figure 3:
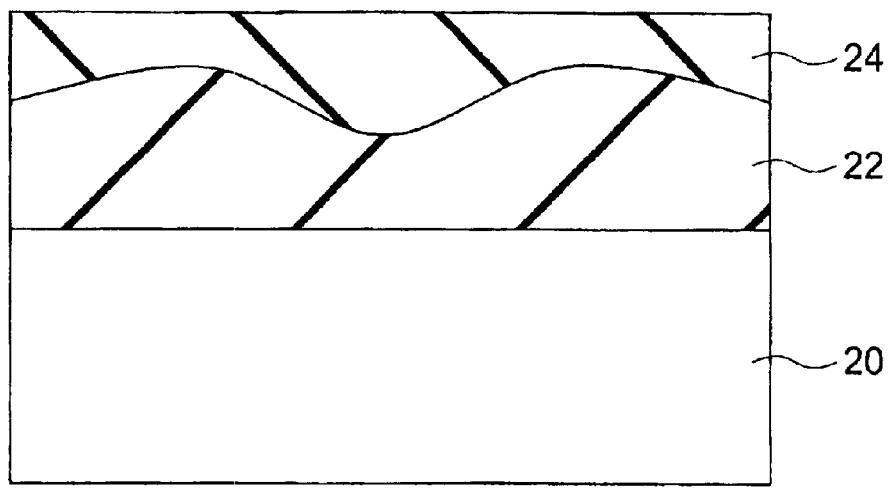
FIG. 3 is a sectional view of one stage of a method of manufacturing a semiconductor device according to a second embodiment of the present invention.

As shown in FIG. 3, in the method of manufacturing a semiconductor device in this embodiment, after devices such as transistors (not shown) are formed on a semiconductor substrate 20, an insulating layer 22 and a wiring layer (not shown) are sequentially formed. Then, an insulating layer 24 is formed on the semiconductor substrate 20 by, for example, the CVD (Chemical Vapor Deposition) method or the spin coating method.

Figure 4:
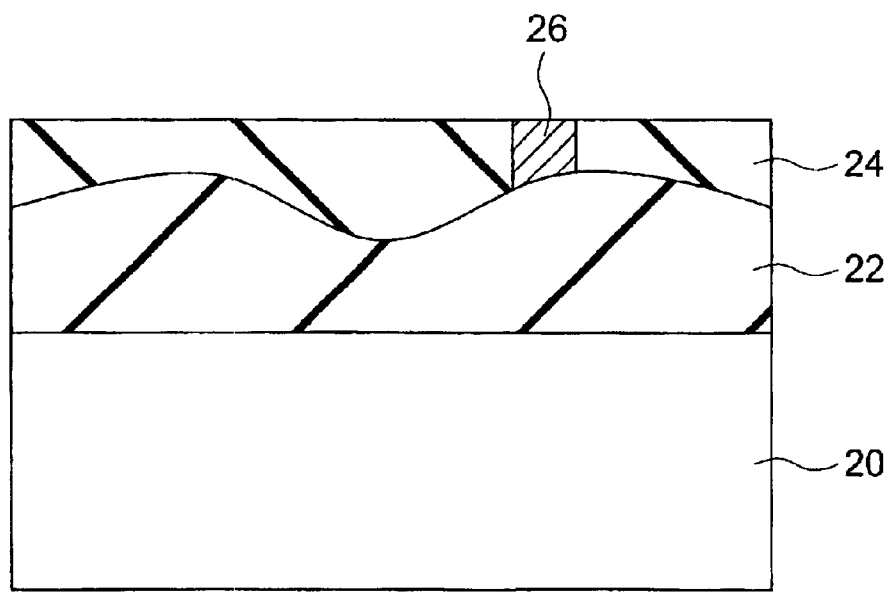
FIG. 4 is a sectional view of another stage of a method of manufacturing a semiconductor device according to the second embodiment of the present invention.

Next, a via hole establishing contact with the wiring layer is formed through the insulating layer 24 by the photolithography method and the RIE (Reactive Ion Etching) method, and the via hole is filled with a metal (e.g., tungsten) to form a via plug 26 (FIG. 4).

Figure 7:
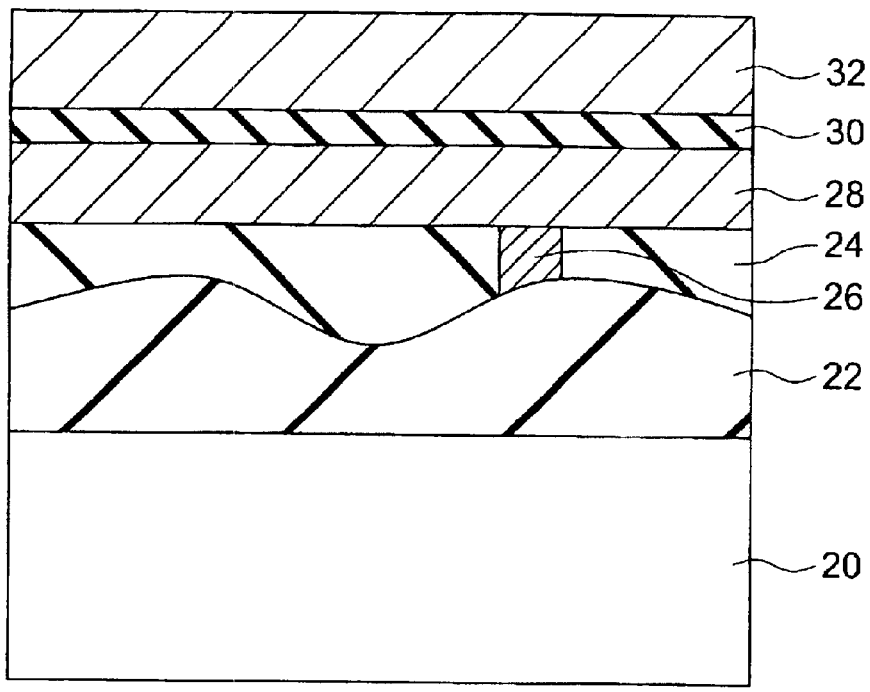
FIG. 7 is a sectional view of still another stage of a method of manufacturing a semiconductor device according to the second embodiment of the present invention.
Figure 8:
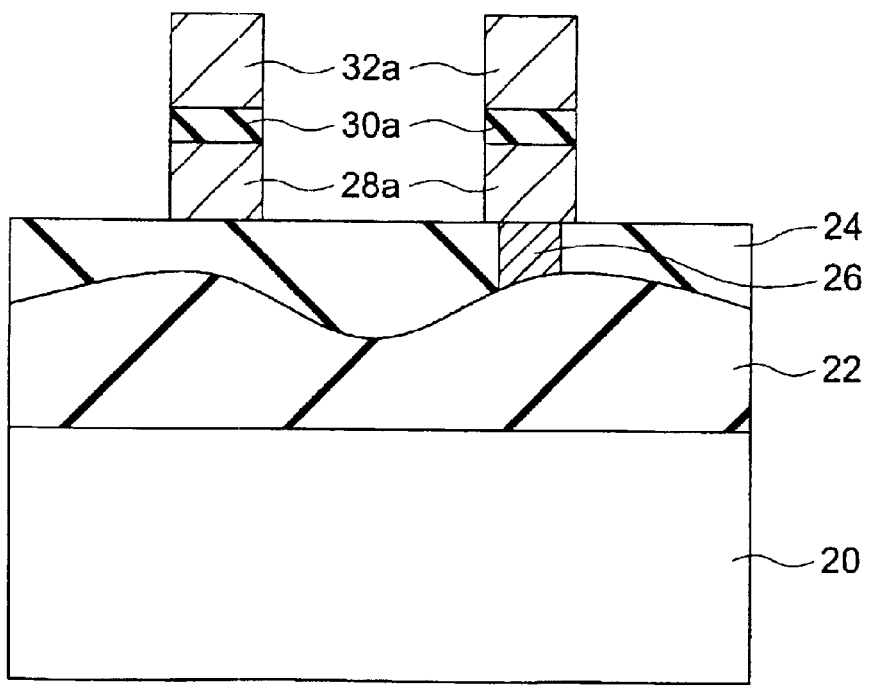
FIG. 8 is a sectional view of still another stage of a method of manufacturing a semiconductor device according to the second embodiment of the present invention.
Figure 10:
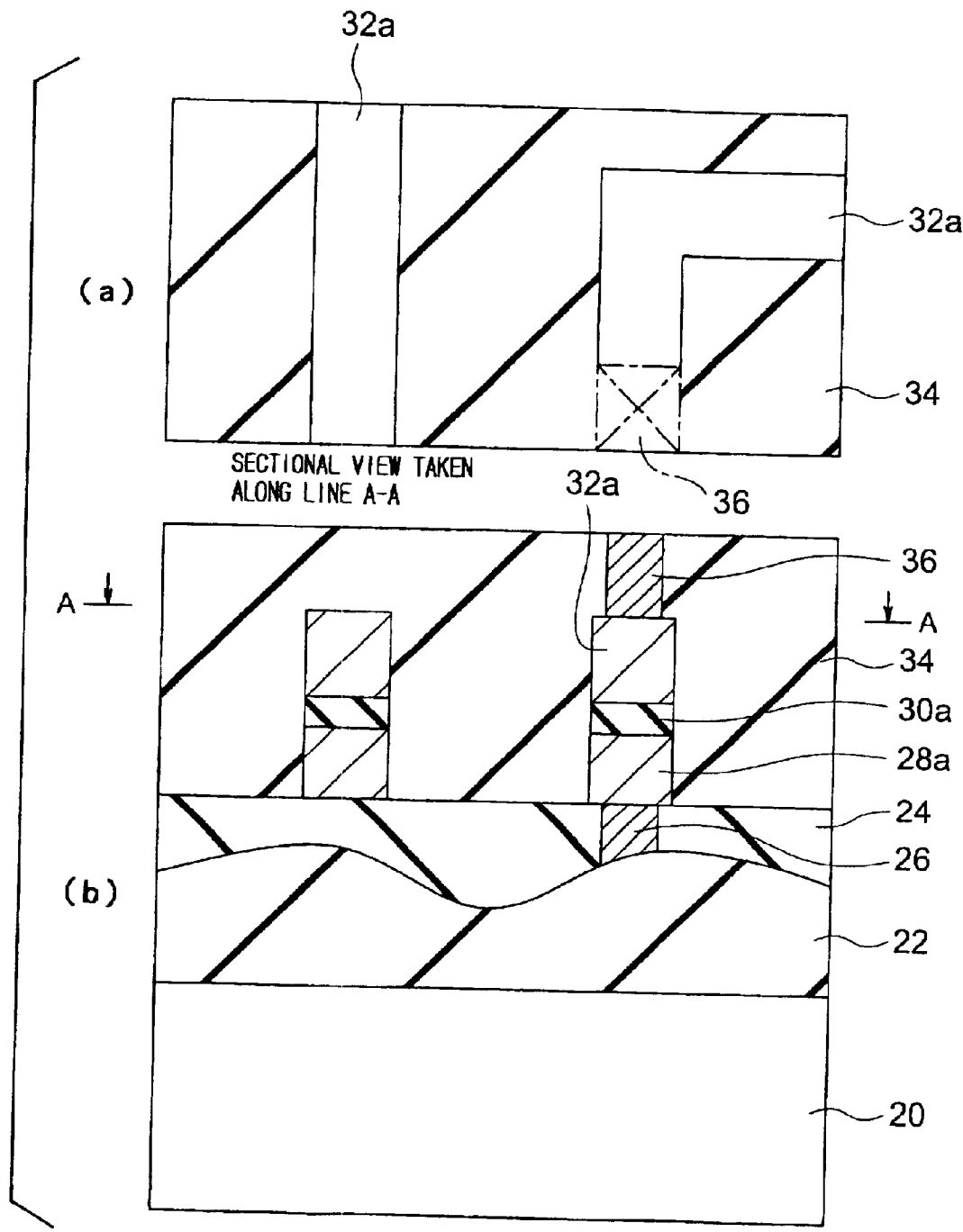
FIG. 10 is a sectional view of a still further stage of a method of manufacturing a semiconductor device according to the second embodiment of the present invention.

Then, as shown in FIG. 5, a metal layer 28 for differential signal lines is formed on the semiconductor substrate 20 so as to cover the insulating layer 24 and the via plug 26. subsequently, an insulating layer 30 is formed on the metal layer 28 by the CVD method or the spin coating method so as to separate the metal layer 28 for differential signal lines from a metal layer for signal lines, which will be described next (FIG. 6). Then, a metal layer 32 for signal lines is formed by the CVD method or the sputtering method, as shown in FIG. 7. Subsequently, the metal layer 32, the insulating layer 30, and the metal layer 28 are patterned at a time by the photolithography method and the RIE method, as shown in FIG. 8, to form pairs of signal lines 32a and differential signal lines 28a. With the above-described procedure, the signal lines 32a and the differential signal lines 28a are formed roughly in the main part of a chip, on which the semiconductor device is formed, via the insulating layer 30a so as to have substantially the same width and to be substantially in parallel with each other.

Next, an insulating layer 34 covering the pairs of the signal lines 32a and the differential signal lines 28a is formed by the CVD method or the spin coating method, as shown in FIG. 9. The insulating layer 34 is smoothed by, for example, the CMP (Chemical Mechanical Polishing) method. Then, as shown in FIG. 10(b), a via hole to establish contact with the signal line 32a is formed through the insulating layer 34 by the photolithography method and the RIE method, and the via hole is filled with a metal (such as tungsten) by, e.g., the CVD method, to form an embedded via plug 36. FIG. 10(b) is a vertical sectional view of the semiconductor device manufactured by the method in this embodiment, and FIG. 10(a) is a horizontal sectional view taken along line A—A of FIG. 10(b). As understood from FIG. 10(a), in this embodiment, one of the two pairs of the signal lines 32a and the differential signal lines 28 (the left pair) is formed straight, and the other (the right pair) is formed so as to bend toward the right side at some midpoint. However, both the signal line pairs are formed so that the signal lines 32a and the differential signal lines 28a via the insulating layer 30a are substantially in parallel with each other, and have substantially the same width roughly in the main part of the chip on which the semiconductor device is formed.

By repeating the above-described procedure, it is possible to form a few layers of stacked pair lines.

As described above, according to the second embodiment, the signal lines 32a and the differential signal lines 28a are formed at a time by the patterning method, together with the insulating layer 30a provided therebetween so as to be in parallel with each other, and to have substantially the same width roughly in the main part of the chip on which the semiconductor device is formed. Therefore, lines of electric field and magnetic field (electromagnetic field) directed from a signal line 32a to the corresponding differential signal line 28a are formed in a narrow area including the signal line 32a and the corresponding differential line 28a. Accordingly, it is possible to prevent the influence of interference between not only vertically adjacent signal lines but also horizontally adjacent signal lines. Thus, it is possible to achieve a structure suitable for miniaturization, which enables a signal transmission with less interference.

Figure 11:
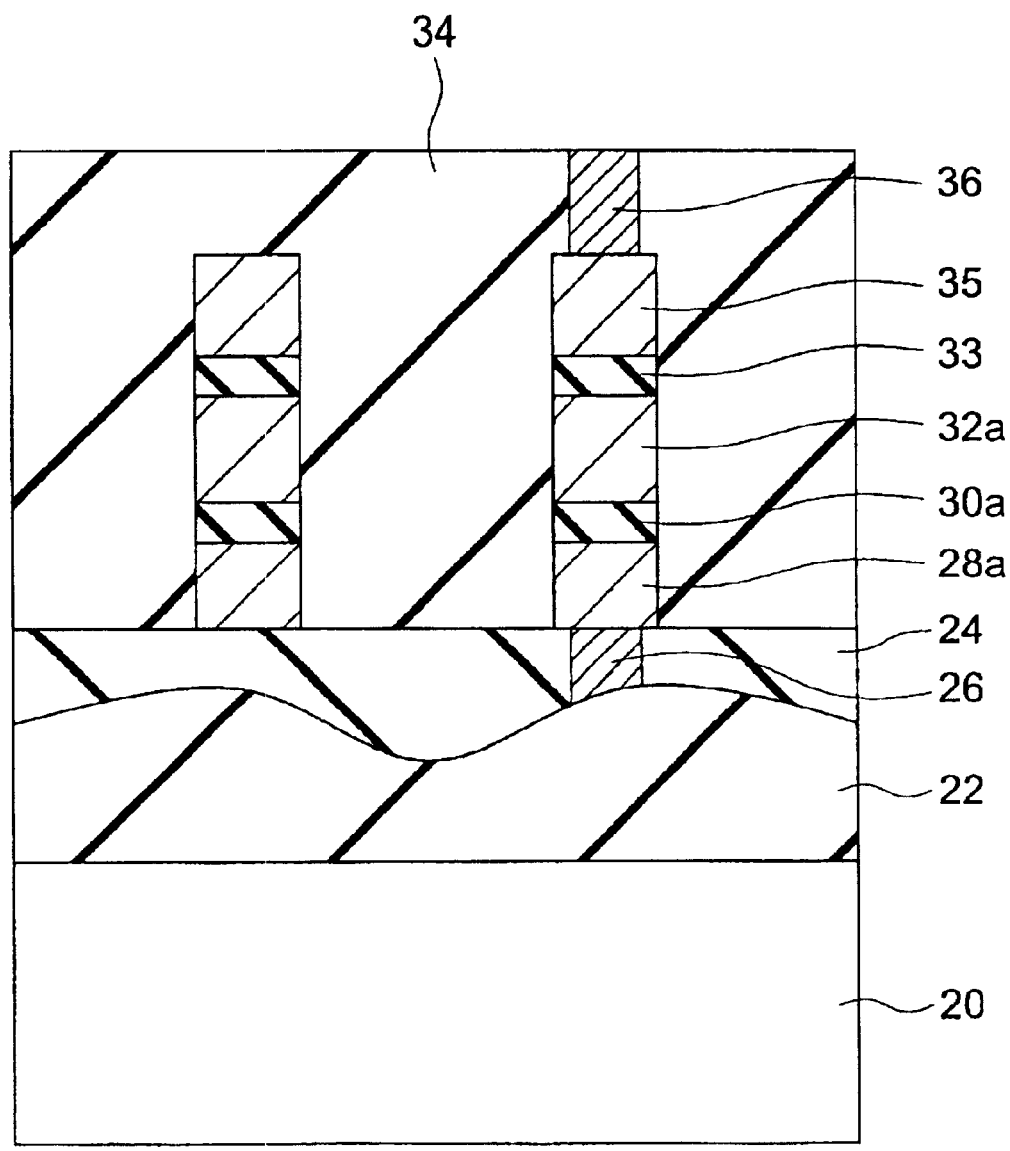
FIG. 11 a sectional view showing the structure of a semiconductor device manufactured by a method according to a modification of the third embodiment.

Although the number of layers of the pairs of signal lines and differential signal lines is two in the semiconductor device manufactured by the method of this embodiment, the number is not limited to two. As shown in FIG. 11, the signal line 32a may be sandwiched between the differential signal lines 28a and 35 via the insulating layers 30a and 33. That is, the semiconductor device manufactured by the modification of the method of this embodiment is obtained by forming the differential signal line 35, via the insulating layer 33, on the signal line 32a of the semiconductor device manufactured by the method of this embodiment. Accordingly, the number of layers is three.

Third Embodiment

Next, a method of manufacturing a semiconductor device according to a third embodiment of the present invention will be described with reference to FIGS. 12 to 21.

In the method of manufacturing a semiconductor device according to this embodiment, a stacked pair line structure is achieved by the Damascene wiring. After devices such as transistors (not shown) are formed on a semiconductor substrate 40, an insulating layer 42 and a wiring layer (not shown) are sequentially formed, as shown in FIG. 12. Subsequently, an insulating layer 44 is formed by, e.g., the CVD method or the spin coating method.

Figure 14:
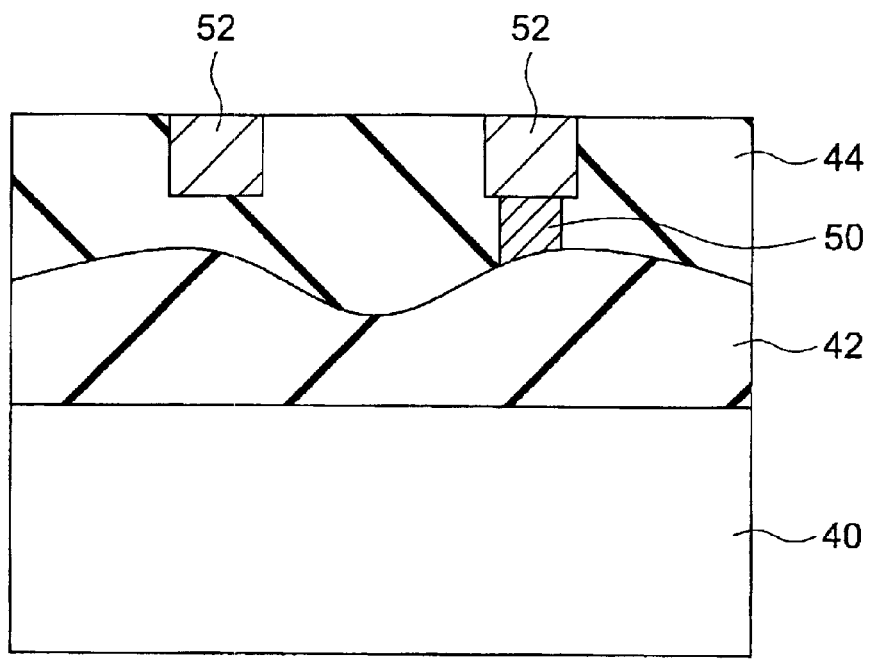
FIG. 14 is a sectional view of still another stage of a method of manufacturing a semiconductor device according to the third embodiment of the present invention.
Figure 15:
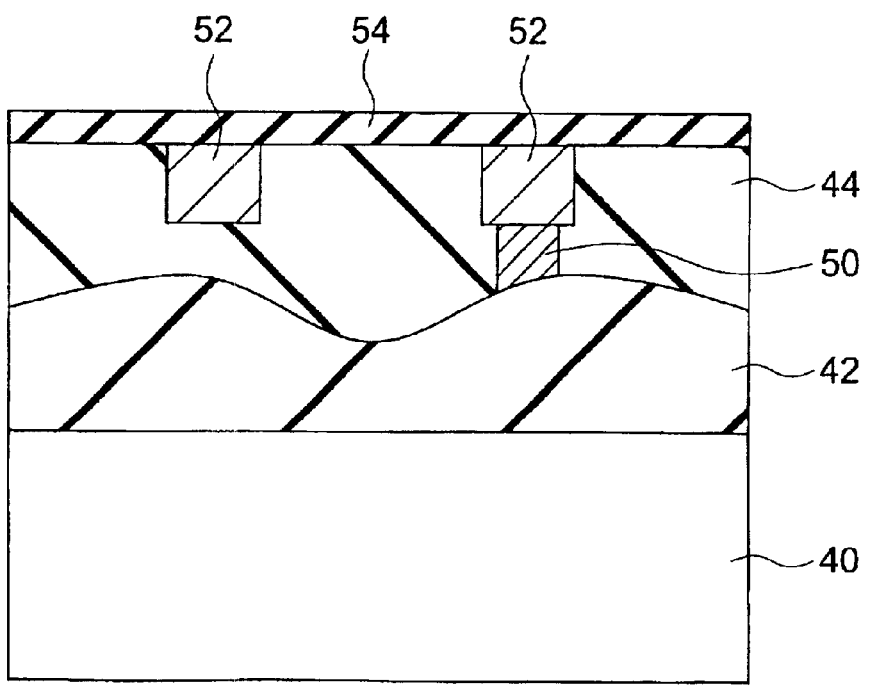
FIG. 15 is a sectional view of still another stage of a method of manufacturing a semiconductor device according to the third embodiment of the present invention.

Next, a via hole 46 establishing contact with the wiring layer, and wiring grooves 48 are formed through the insulating layer 44 by the photolithography method and the RIE method, as shown in FIG. 13, in which a metal (e.g., tungsten) is embedded by the CVD method, the sputtering method or the electroplating method. After that, a via plug 50 and differential signal lines 52 are formed by removing unnecessary metal overflowing the wiring grooves 48 by the CMP method (FIG. 14). Then, an insulating layer 54 covering the differential signal lines 52 and the insulating layer 44 is formed by the CVD method or the spin coating method, as shown in FIG. 15.

Figure 16:
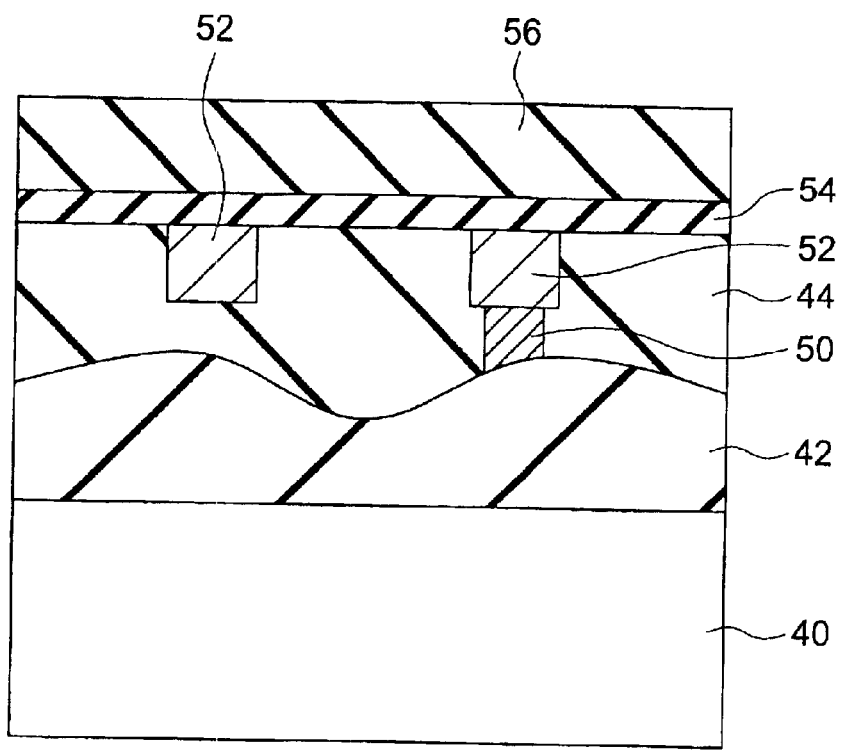
FIG. 16 is a sectional view of still another stage of a method of manufacturing a semiconductor device according to the third embodiment of the present invention.
Figure 17:
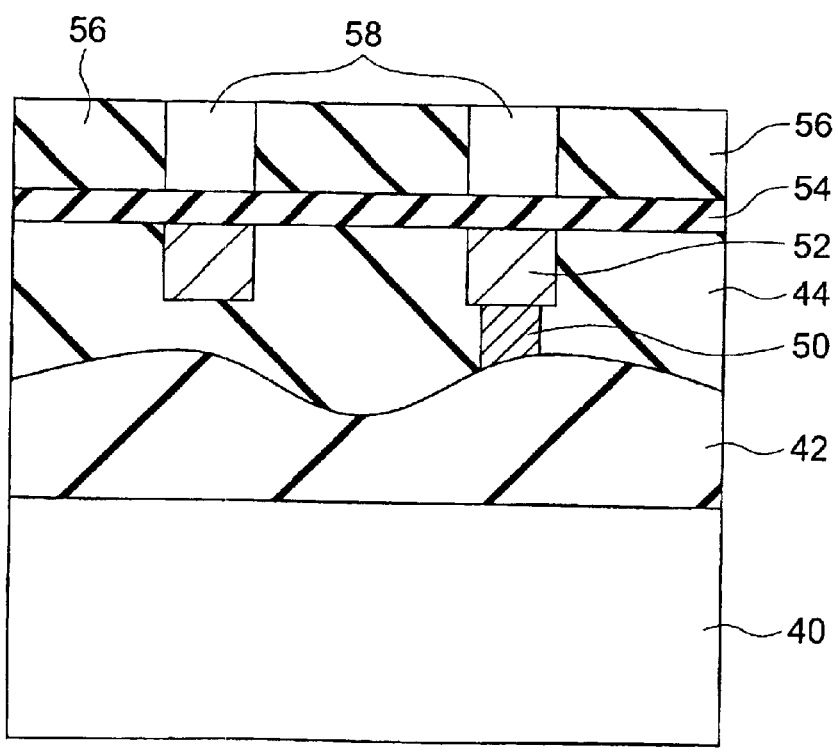
FIG. 17 is a sectional view of still another stage of a method of manufacturing a semiconductor device according to the third embodiment of the present invention.

Next, as shown in FIG. 16, an insulating layer 56 is formed so as to cover the insulating layer 54 by, for example, the CVD method. Then, as shown in FIG. 17, grooves 58 for signal lines are formed through the insulating layer 56 at positions corresponding to the differential signal lines 52 so as to be in substantially parallel with the differential signal lines 52, and to have substantially the same width as the differential signal lines 52, roughly in the main part of the chip on which the semiconductor device is formed. The grooves 58 are formed such that the insulating layer 54 appears at the bottom thereof.

Figure 18:
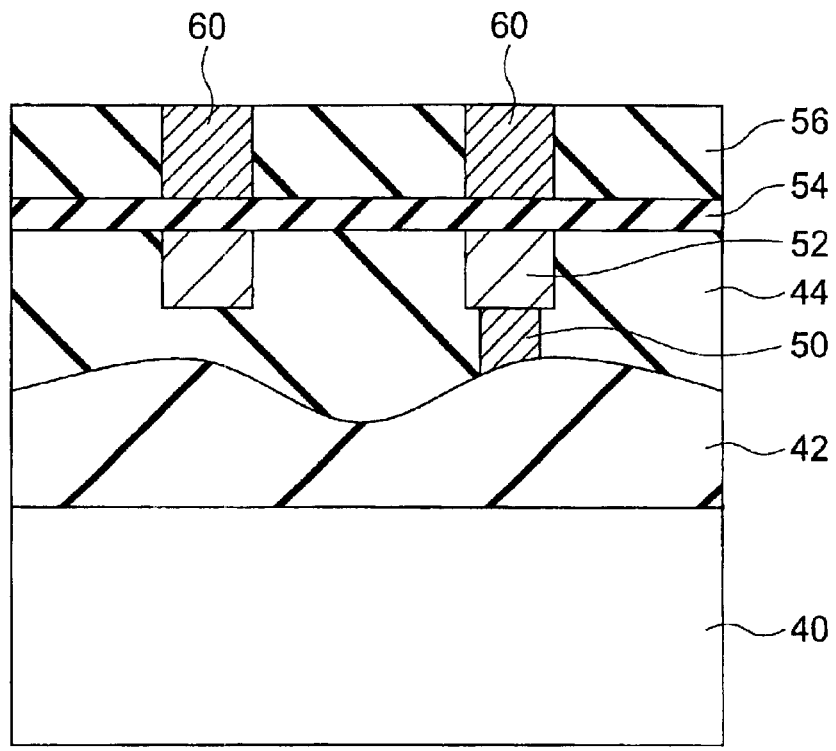
FIG. 18 is a sectional view of still another stage of a method of manufacturing a semiconductor device according to the third embodiment of the present invention.

Then, the grooves 58 are filled with a metal by the CVD method, the sputtering method, or the electroplating method. After that, signal lines 60 are formed in the insulating layer 56 by removing unnecessary metal overflowing the grooves 58 by, e.g., the CMP method, as shown in FIG. 18.

Figure 19:
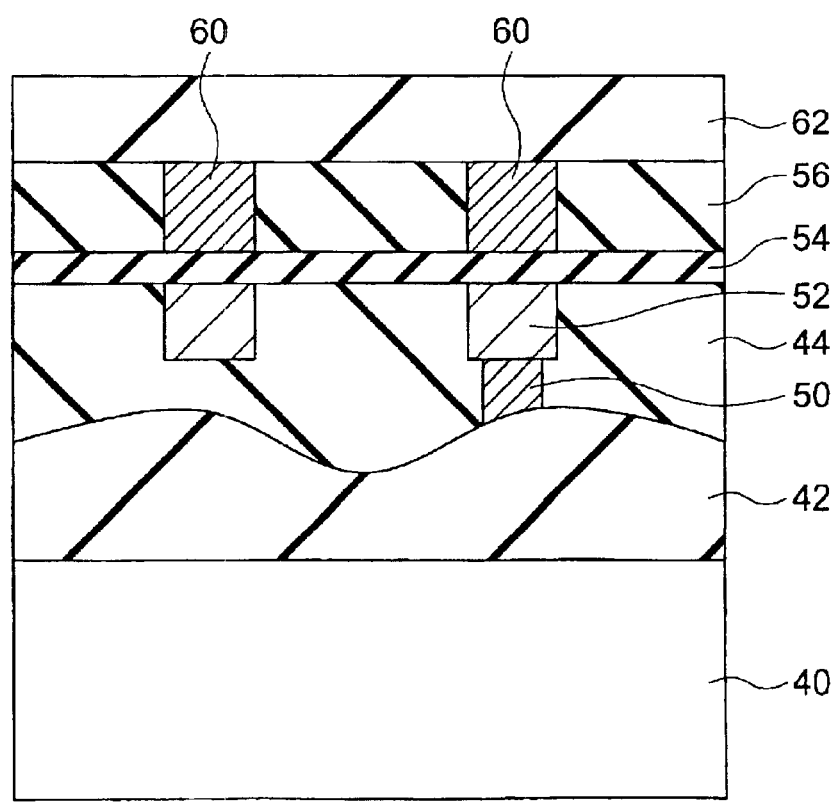
FIG. 19 is a sectional view of a further stage of method of manufacturing a semiconductor device according to the third embodiment of the present invention.

In this way, the pairs of differential signal lines 52 and the corresponding signal lines 60 are formed via the insulating layer 54 so as to have substantially the same width and to be substantially in parallel with each other roughly in the main part of the chip on which the semiconductor device is formed. Then, an insulating layer 62 covering the signal lines 60 is formed by, e.g., the CVD method or the spin coating method, as shown in FIG. 19.

Figure 20:
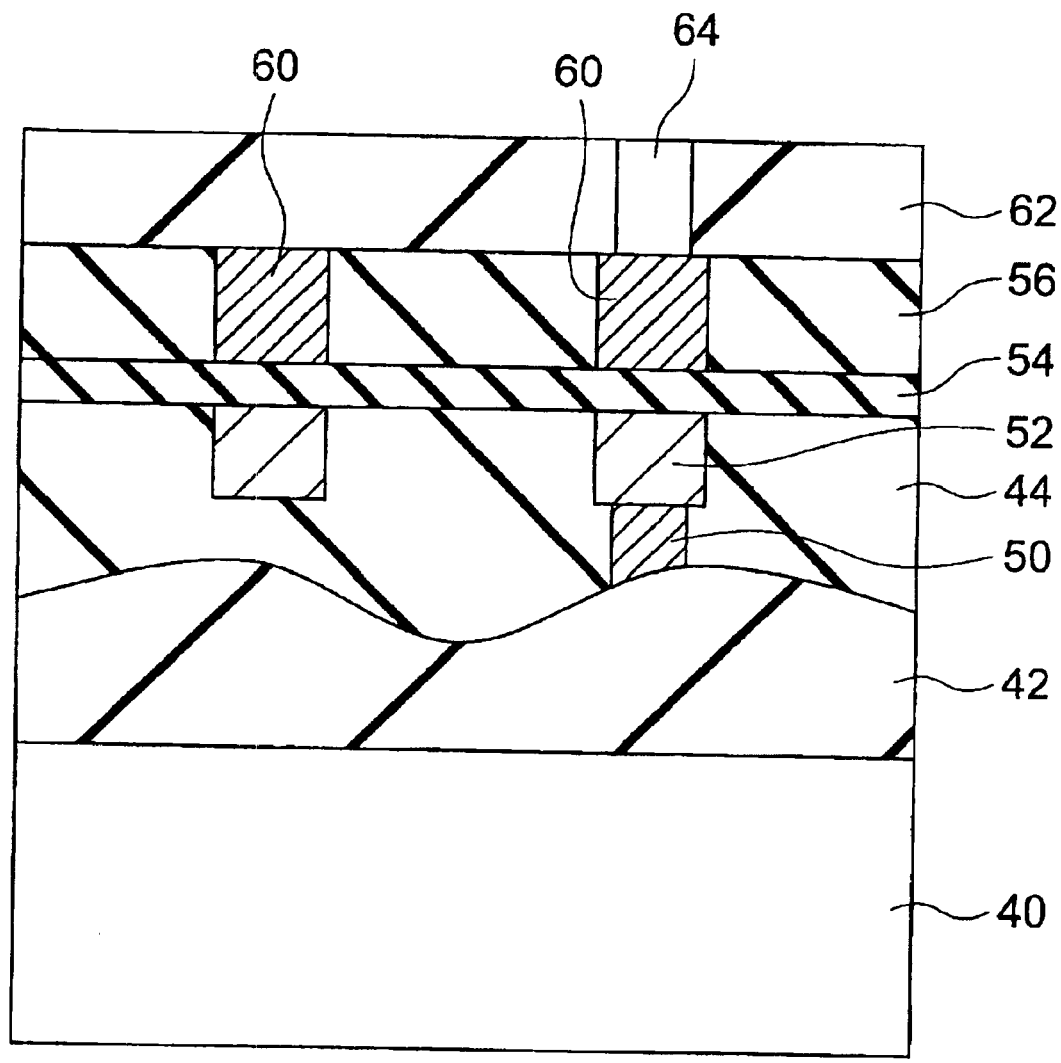
FIG. 20 is a sectional view of a still further stage of a method of manufacturing a semiconductor device according to the third embodiment of the present invention.

Next, as shown in FIG. 20, a via hole 64 establishing contact with the signal line 60 is formed through the insulating layer 62 by the photolithography method and the RIE method. After that, the via hole 64 is filled with a metal, and unnecessary metal overflowing the via hole 64 is removed by, e.g., the CMP method, thereby forming a via plug 66 in the insulating layer 52, as shown in FIG. 21(b). FIG. 21(b) is a vertical sectional view of the semiconductor device manufactured by the method of this embodiment, and FIG. 21(a) is a horizontal sectional view taken along line A—A of FIG. 21(b). As understood from FIG. 21(a), in this embodiment, one of the two pairs of the signal lines 60 and the differential signal lines 52 (the left pair) is formed straight, and the other (the right pair) is formed so as to bend toward the right side at some midpoint. However, both the signal line pairs are formed so that the signal lines 60 and the differential signal lines 52 via the insulating layer 54 are substantially in parallel with each other, and have substantially the same width roughly in the main part of the chip on which the semiconductor device is formed.

By repeating the above-described procedure, it is possible to form a few layers of stacked pair lines.

As described above, according to this embodiment, the signal lines 60 and the differential signal lines 52 are formed via the insulating layer 54 so as to be substantially in parallel with each other, and to have substantially the same width roughly in the main part of the chip on which the semiconductor device is formed. Therefore, lines of electric field and magnetic field (electromagnetic field) directed from a signal line 60 to the corresponding differential signal line 52 are formed in a narrow area including the signal line 60 and the corresponding differential line 52. Accordingly, it is possible to prevent the influence of interference between not only vertically adjacent signal lines but also horizontally adjacent signal lines. Thus, it is possible to achieve a structure suitable for miniaturization, which-can achieve a signal transmission with less interference.

Figure 22:
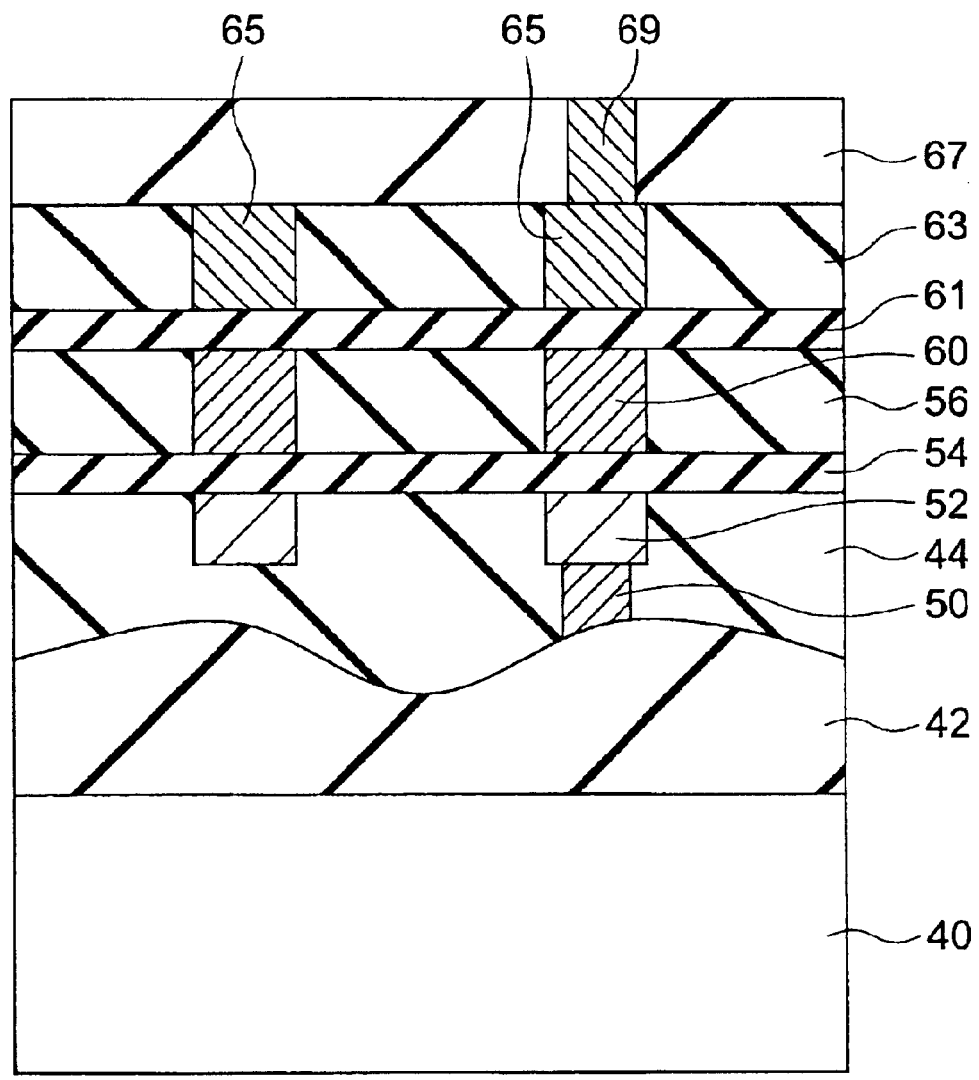
FIG. 22 is a sectional view showing the structure of a semiconductor device manufactured by a method according to a first modification of the third embodiment.

Although the number of layers of the pairs of signal lines differential signal lines is two in this embodiment, the number is not limited to two. The signal line 60 may be sandwiched between the differential signal lines 52 and 65. That is, the semiconductor device manufactured by the modification of the method of this embodiment shown in FIG. 22 is obtained by forming an insulating layers 61 and 63 so as to cover the signal lines 60, forming the differential signal lines 65 in the insulating layer 63 at the positions corresponding to those of the signal lines 60, forming an insulating layer 67 so as to cover the differential signal lines 65, and forming a via plug 69 establishing contact with the differential signal liens 65 in the insulating layer 67, in the semiconductor device manufactured by the method of this embodiment shown in FIG. 20. Accordingly, the number of layers is three.

Figure 23:
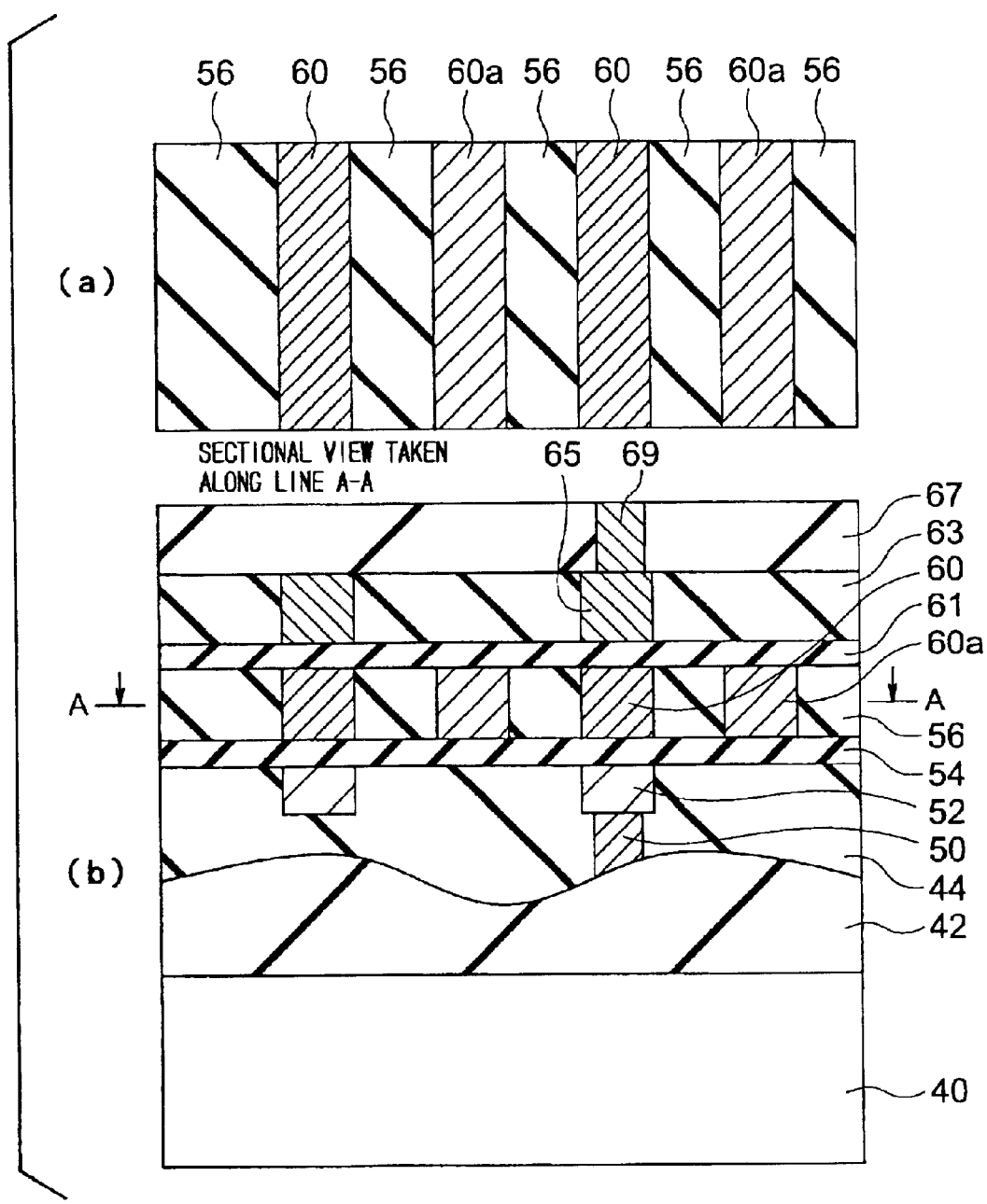
FIG. 23 is a sectional view showing the structure of a semiconductor device manufactured by a method according to a second modification of the third embodiment.

Further, the third embodiment may be modified so as to have a structure shown in FIG. 23. That is, the semiconductor device according to the second modified example of this embodiment is obtained by forming differential signal lines 60a in the same layer as that of the signal lines 60 in the first modified example of the third embodiment shown in FIG. 22.

Of course, the semiconductor devices of both the first and the second modified examples of the third embodiment have the same advantageous effects as the semiconductor device of the third embodiment.

Fourth Embodiment

Next, a method of manufacturing a semiconductor device according to a fourth embodiment of the present invention will be described with reference to FIGS. 24 to 32.

Figure 24:
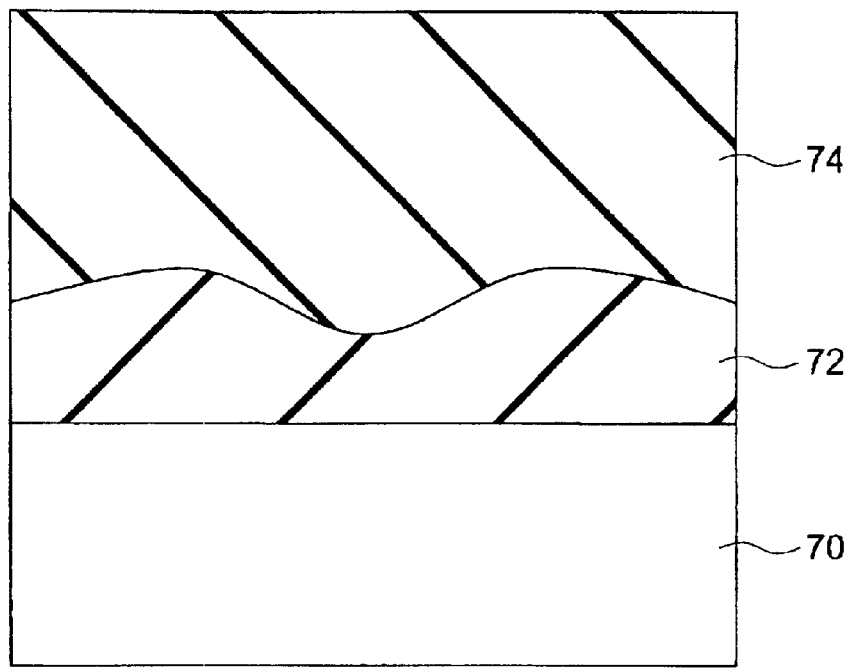
FIG. 24 is a sectional view of one stage of a method of manufacturing a semiconductor device according to a fourth embodiment of the present invention.

In the method of manufacturing a semiconductor device according to this embodiment, a stacked pair line structure is achieved by the Damascene wiring. After devices such as transistors (not shown) are formed on a semiconductor substrate 70, a insulating layer 72 and a wiring layer (not shown) are sequentially formed, as shown in FIG. 24. Subsequently, an insulating layer 74 is formed by, e.g., the CVD method or the spin coating method, as shown in FIG. 24.

Figure 25:
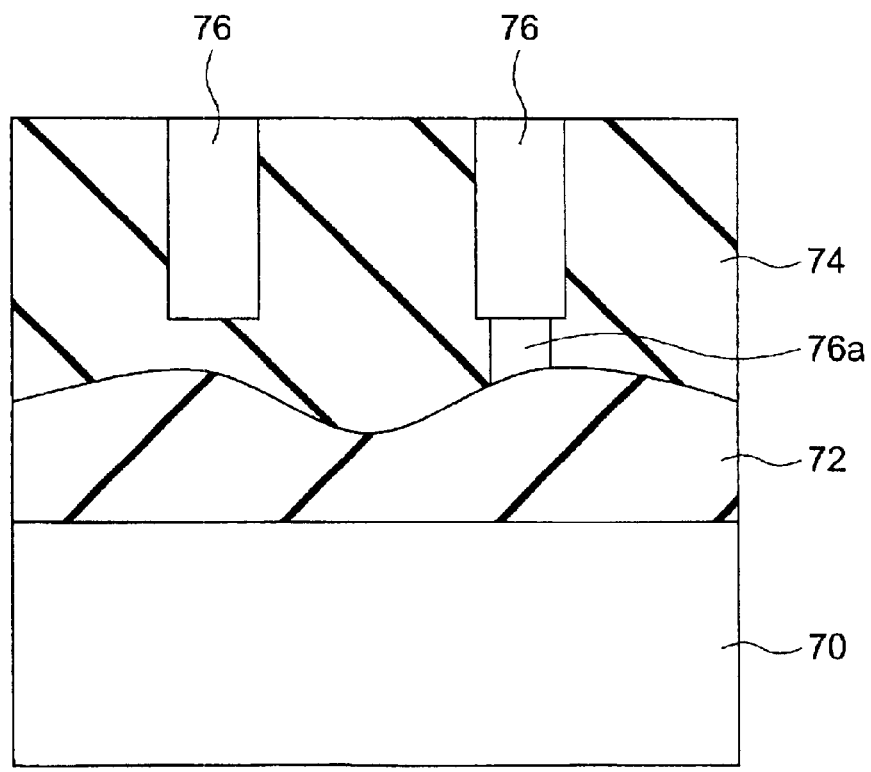
FIG. 25 is a sectional view of another stage of a method of manufacturing a semiconductor device according to the fourth embodiment of the present invention.
Figure 26:
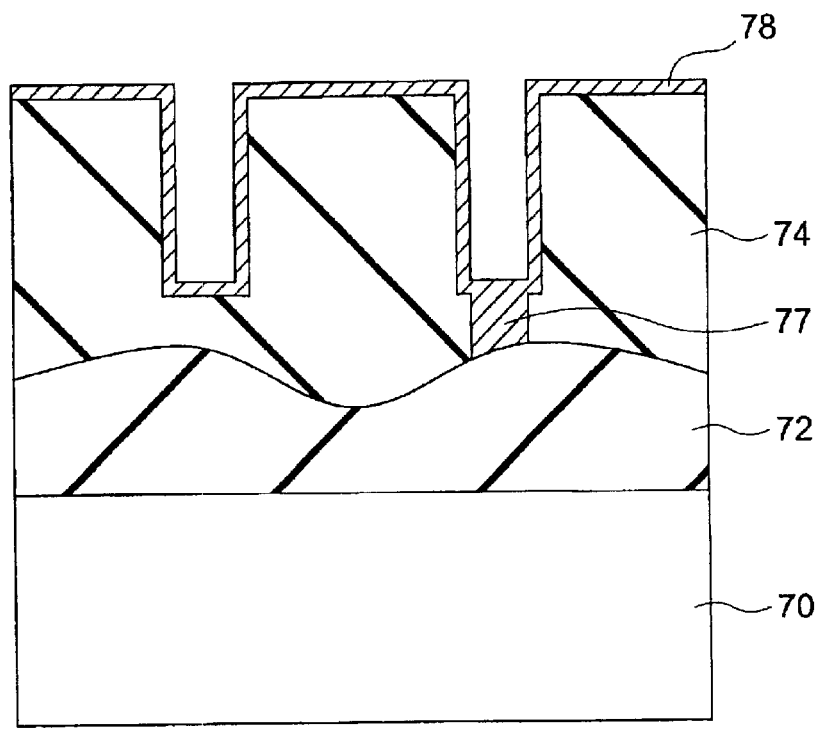
FIG. 26 is a sectional view of still another stage of a method of manufacturing a semiconductor device according to the fourth embodiment of the present invention.
Figure 27:
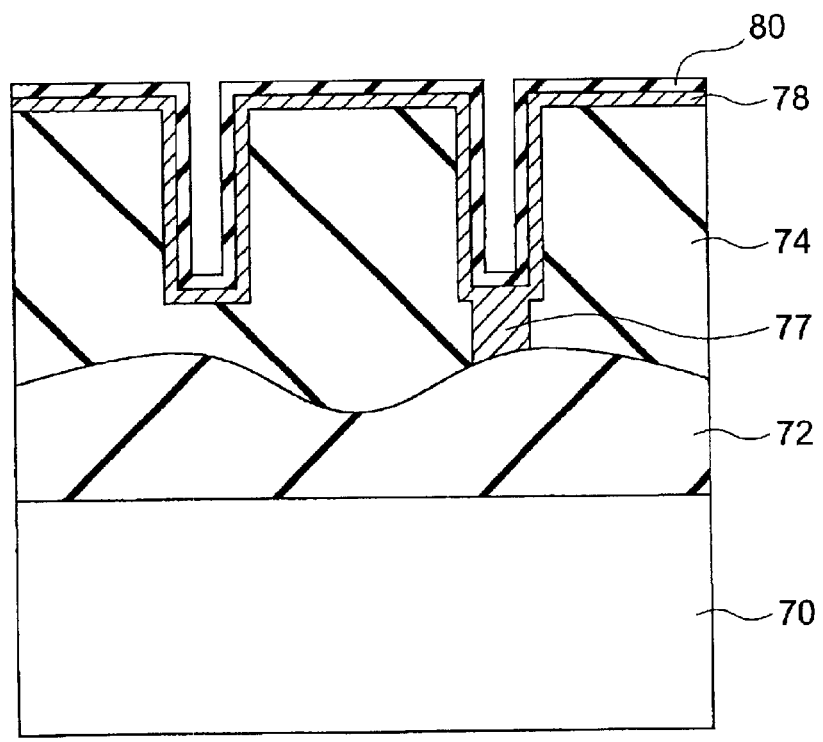
FIG. 27 is a sectional view of still another stage of a method of manufacturing a semiconductor device according to the fourth embodiment of the present invention.
Figure 30:
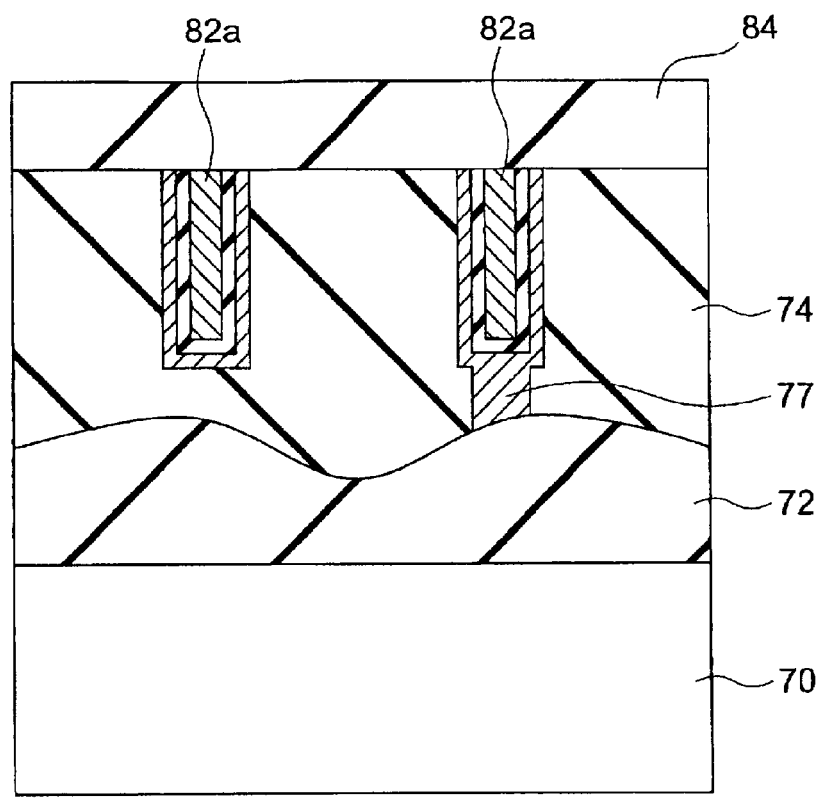
FIG. 30 is a sectional view of a further stage of a method of manufacturing a semiconductor device according to the fourth embodiment of the present invention.
Figure 31:
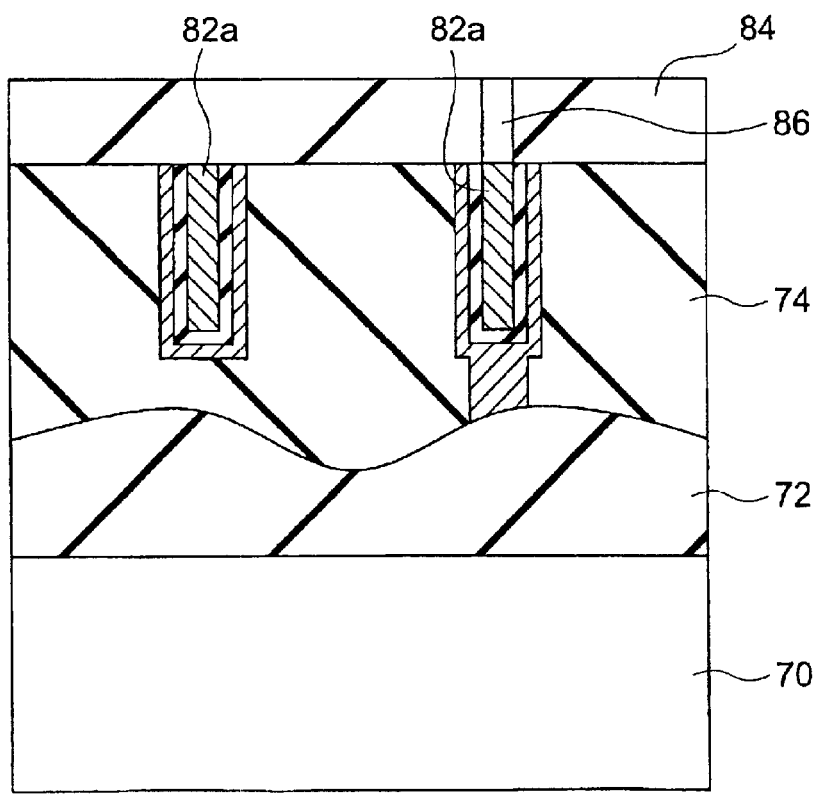
FIG. 31 is a sectional view of a still further stage of a method of manufacturing a semiconductor device according to the fourth embodiment of the present invention.
Figure 32:
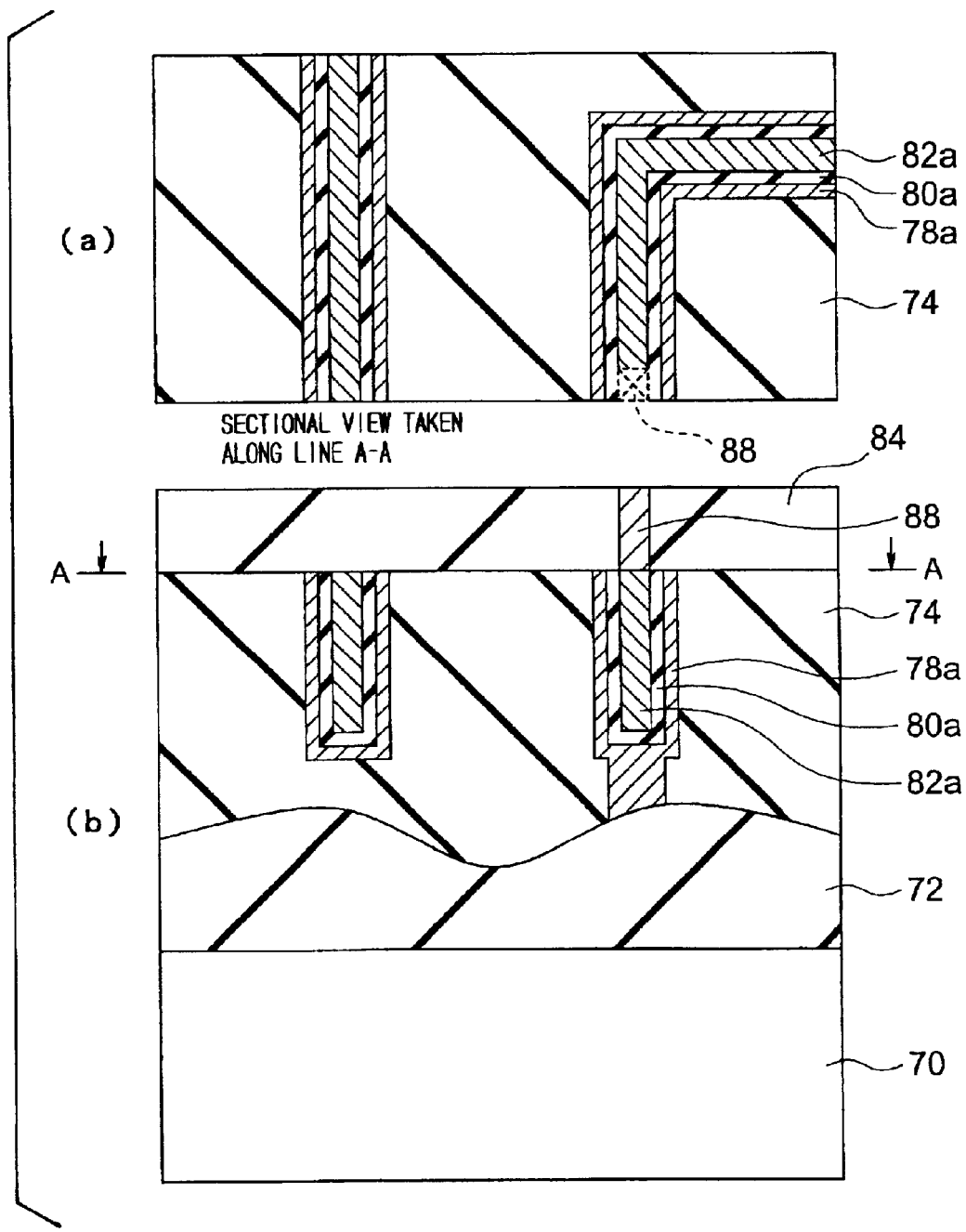
FIG. 32 is a sectional view of a yet further stage of a method of manufacturing a semiconductor device according to the fourth embodiment of the present invention.
Figure 33:
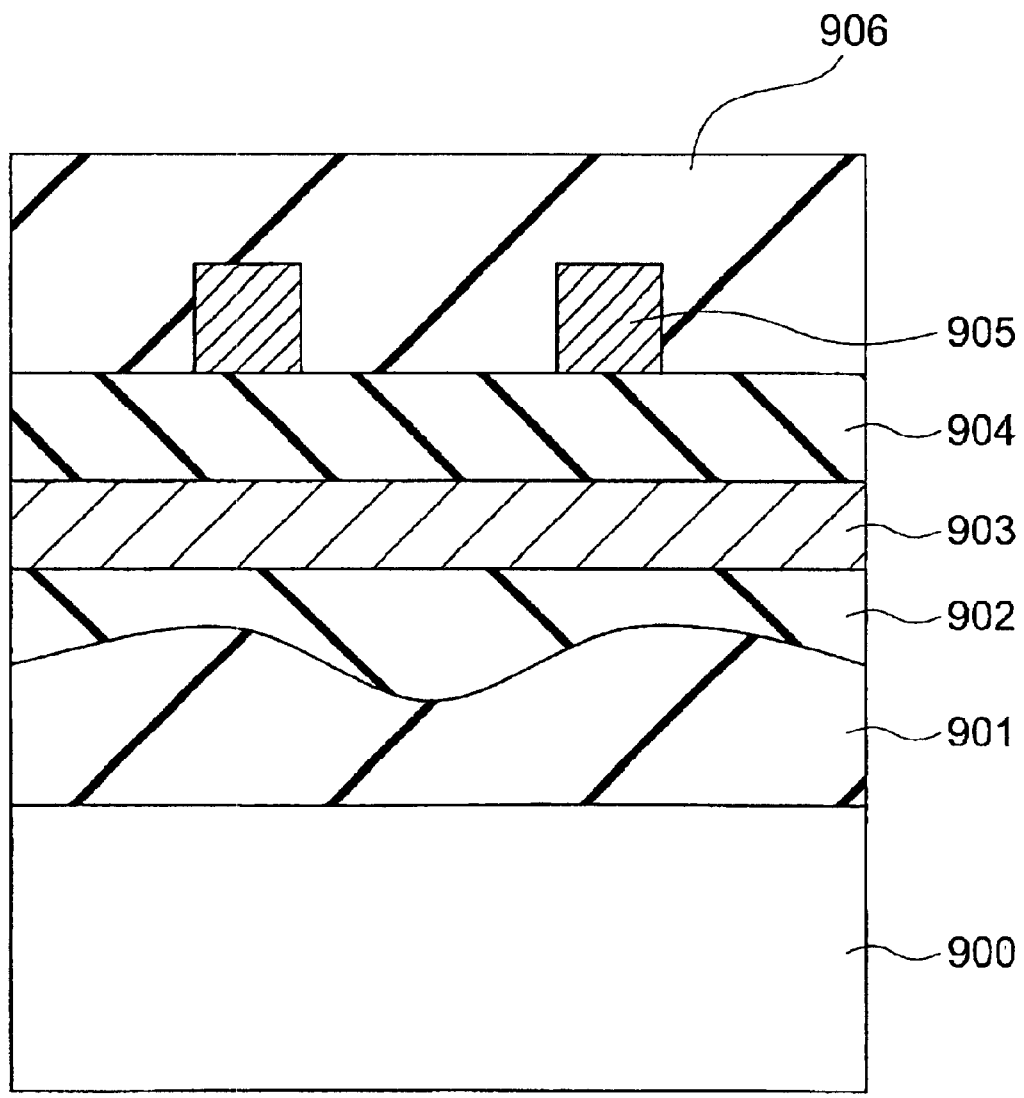
FIG. 33 is a sectional view showing the structure of a semiconductor device having a microstrip line structure.
Figure 34:
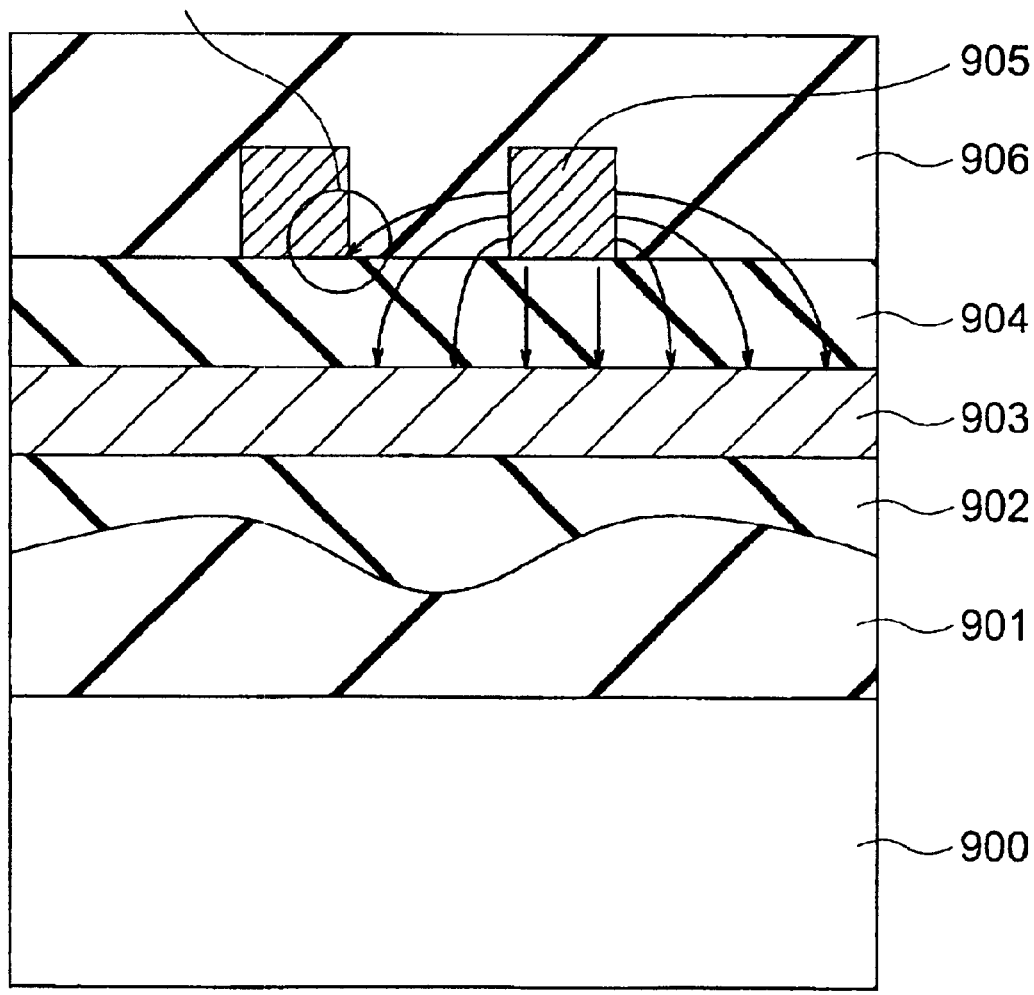
FIG. 34 is a drawing for explaining problems of the semiconductor device having the microstrip line structure.

Next, a plurality of grooves 76 are formed in the insulating layer 74, as shown in FIG. 25. Via holes 76a are formed under some of the grooves 76 so as to establish contact with the wiring layer. Subsequently, a metal is deposited over the semiconductor substrate 70 by, e.g., CVD method to fill the via holes 76 to form a via plug 77 a, and at the same time to form a metal layer 78 serving as a differential signal line along the walls and bottoms of the grooves 76, as shown in FIG. 26. After that, an insulating layer 80 is formed so as to cover the metal layer 78, as shown in FIG. 27.

Next, a metal is deposited to form a metal layer 82, serving as a signal line and covering the insulating layer 80, as shown in FIG. 28. Then, the unnecessary portions of metal layer 82, insulating layer 80, and metal layer 78 formed over the insulating layer 74 are removed by, e.g., the CMP method, to form differential signal lines 78a, insulating layers 80a, and signal lines 80a in the grooves, as shown in FIG. 29. Accordingly, in this embodiment, a pair of differential signal line 78a and signal line 82a is formed in a groove via an insulating layer 80a.

Then, an insulating layer 84 is formed over the entire surface of the layers on the semiconductor substrate 70. Subsequently, a via hole 86 establishing contact with the signal line 82a is formed in the insulating layer 84. After that, the via hole 86 is filled with a metal to form a via plug 88, as shown in FIG. 32(b). FIG. 32(b) is a vertical sectional view of the semiconductor device manufactured by the method of this embodiment, and FIG. 32(a) is a horizontal sectional view taken along line A—A of FIG. 32(b). As understood from FIG. 32(a), in this embodiment, one of the two pairs of the signal lines 82a and the differential signal lines 78a (the left pair), formed in the grooves, is formed straight, and the other (the right pair) is formed so as to bend toward the right side at some midpoint. However, both the signal line pairs are formed so that the signal lines 82a and the differential signal lines 78a via the insulating layer 80a in the grooves are substantially in parallel with each other roughly in the main part of the chip on which the semiconductor device is formed. By repeating the above-described procedure, it is possible to form a few layers of stacked pair lines.

As described above, according to this embodiment, the signal lines 82a and the differential signal lines 78a are formed via the insulating layer 80a so as to be substantially in parallel with each other roughly in the main part of the chip on which the semiconductor device is formed. Therefore, lines of electric field and magnetic field (electromagnetic field) directed from a signal line 82a to the corresponding differential signal line 78a are formed in a narrow area including the signal line 82a and the corresponding differential line 78a. Accordingly, it is possible to prevent the influence of interference between not only vertically adjacent signal lines but also horizontally adjacent signal lines. Thus, it is possible to achieve a structure suitable for miniaturization, which enables a signal transmission with less interference.

Although signal lines are formed over differential lines via an insulating layer in the first to fourth embodiments, of course differential lines may be formed over signal lines via an insulating layer to have the same advantageous effects.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:

a signal line, which is capable of passing a signal having a desired frequency $f_0$ therethrough, formed on a semiconductor substrate; and a differential signal line through which a signal in opposite phase to said signal passes, or which is connected to a ground power supply, said signal line and said differential signal line being laminated via an insulating layer so as to be substantially in parallel with each other, and an actual wiring length l of said signal line being longer than a wiring length $l_0$ determined by the following equation $$l_0 = \sqrt{\frac{\frac{L}{C} + \sqrt{\frac{R^2 + 8\pi^2 f_0^2 L^2}{4\pi^2 f_0^2 C^2}}}{R^2 + 4\pi^2 f_0^2 L^2}}$$

where R represents a resistance component, L represents an inductance component, and C represent a capacitance component per unit length of said signal line in such a case that said differential signal line does not exist.

2. The semiconductor device according to claim 1, wherein said signal line has substantially the same width with said differential signal line, and said signal line is located at a position corresponding to that of said differential signal line via said insulating layer in the main part of said semiconductor substrate.

3. The semiconductor device according to claim 1, further comprising a second differential signal line formed via a second insulating layer at a side opposite to that of said differential signal line formed via said insulating layer relative to said signal line.

4. The semiconductor device according to claim 1, wherein there are at least two of said signal lines, which are formed in the same layer, and a second differential signal line different from said first differential signal line is formed between said at least two signal lines in the same layer.

5. The semiconductor device according to claim 1, wherein said signal line, said insulating layer, and said differential signal line are formed in a groove in a second insulating layer formed on said semiconductor substrate.

6. The semiconductor device according to claim 1, wherein said signal line and said differential signal line are substantially in parallel with each other in the main part of said semiconductor substrate.

7. The semiconductor device according to claim 1, wherein the frequency is 1 GHz or more.

8. A semiconductor device comprising:
- at least two signal lines, each being capable of passing a first signal, formed in the same layer above a semiconductor substrate;
- first differential signal lines through which a signal in opposite phase to said first signal passes, or which is connected to a ground power supply;
- a second differential signal line formed between said at least two signal lines in the same layer;
- said at least two signal lines and said first differential signal lines being laminated via an insulating layer so as to be substantially in parallel with each other; and
- said at least two signal lines located at positions corresponding to those of said first differential signal lines via said insulating layer in a majority part of said semiconductor substrate.

9. The semiconductor device according to claim 8, further comprising third differential signal lines formed via a second insulating layer at sides opposite to those of said first differential signal lines formed via said insulating layer relative to said at least two signal lines.

10. The semiconductor device according to claim 8, wherein said at least two signal lines and said first differential signal lines are substantially in parallel with each other in said majority part of said semiconductor substrate.

11. The semiconductor device according to claim 8, wherein a frequency of the first signal is 1 GHz or more.

* * * * *